US012471213B2

(12) United States Patent
Shin et al.

(10) Patent No.: US 12,471,213 B2
(45) Date of Patent: *Nov. 11, 2025

(54) CIRCUIT BOARD

(71) Applicant: LG INNOTEK CO., LTD., Seoul (KR)

(72) Inventors: Jong Bae Shin, Seoul (KR); Soo Min Lee, Seoul (KR); Jae Hun Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 241 days.

This patent is subject to a terminal disclaimer.

(21) Appl. No.: 18/026,917

(22) PCT Filed: Sep. 17, 2021

(86) PCT No.: PCT/KR2021/012807
§ 371 (c)(1),
(2) Date: Mar. 17, 2023

(87) PCT Pub. No.: WO2022/060166
PCT Pub. Date: Mar. 24, 2022

(65) Prior Publication Data
US 2023/0328886 A1    Oct. 12, 2023

(30) Foreign Application Priority Data
Sep. 18, 2020  (KR) .................. 10-2020-0120509

(51) Int. Cl.
*H05K 1/11* (2006.01)
*H05K 1/18* (2006.01)
(Continued)

(52) U.S. Cl.
CPC ............. *H05K 1/111* (2013.01); *H05K 1/183* (2013.01); *H05K 1/185* (2013.01); *H05K 3/4697* (2013.01);
(Continued)

(58) Field of Classification Search
CPC ........ H05K 1/111; H05K 1/183; H05K 1/185; H05K 3/4697; H05K 1/0271;
(Continued)

(56) References Cited

U.S. PATENT DOCUMENTS 11,406,013 B2    8/2022  Kasuya
12,144,116 B2 *  11/2024 Shin .................... H05K 3/0032
(Continued)

FOREIGN PATENT DOCUMENTS

JP    S62-163347    7/1987
JP    2012-164952   8/2012
(Continued)

OTHER PUBLICATIONS

Extended European Search Report dated Nov. 12, 2024, issued in Application No. 21869788.6.
(Continued)

*Primary Examiner* — Ishwarbhai B Patel
(74) *Attorney, Agent, or Firm* — KED & ASSOCIATES

(57) ABSTRACT

A circuit board including a first insulating layer; a first circuit pattern disposed on the first insulating layer; and a second insulating layer disposed on the first insulating layer and including a cavity. An upper surface of the first insulating layer includes a first region that does not vertically overlap the cavity; a second region vertically overlapping the cavity; and a boundary region between the first region and the second region. The first circuit pattern includes a first-first circuit pattern disposed on the boundary region of the first insulating layer. The first-first circuit pattern includes a first portion that does not vertically overlap the cavity, and a second portion connected to the first portion and vertically overlapping the cavity. A thickness of the first (Continued)

portion of the first-first circuit pattern is different from a thickness of the second portion of the first-first circuit pattern.

20 Claims, 16 Drawing Sheets

(51) Int. Cl.
  *H05K 3/46* (2006.01)
  *H05K 1/02* (2006.01)
  *H05K 1/03* (2006.01)
(52) U.S. Cl.
  CPC ......... *H05K 1/0271* (2013.01); *H05K 1/0366* (2013.01); *H05K 1/186* (2013.01)
(58) Field of Classification Search
  CPC ............... H05K 1/0366; H05K 3/0035; H05K 2201/0145; H05K 2201/0154; H05K 2201/09036; H05K 2203/107; H05K 1/186; H01L 23/3121; H01L 23/3142; H01L 21/4857; H01L 23/49822; H01L 23/13; H01L 23/481; H01L 23/485; H01L 23/50; H01L 23/5226; H01L 23/528; H01L 24/06; H01L 24/09
  See application file for complete search history.

(56) References Cited

U.S. PATENT DOCUMENTS

| | | | |
|---|---|---|---|
| 2007/0095471 A1 | 5/2007 | Ito et al. | |
| 2012/0186861 A1 | 7/2012 | Shimizu et al. | |
| 2013/0299223 A1* | 11/2013 | Yoo | H05K 3/4697 174/250 |
| 2014/0138130 A1* | 5/2014 | Chang | H01L 24/32 174/257 |
| 2016/0037647 A1* | 2/2016 | Shimizu | H05K 3/4697 361/764 |
| 2017/0055349 A1 | 2/2017 | Chang et al. | |
| 2018/0033719 A1* | 2/2018 | Tsai | H05K 3/22 |
| 2020/0029445 A1 | 1/2020 | Kim et al. | |
| 2020/0144234 A1* | 5/2020 | Jeon | H01L 23/49822 |
| 2021/0045241 A1* | 2/2021 | Kasuya | H05K 1/183 |

FOREIGN PATENT DOCUMENTS

| | | |
|---|---|---|
| JP | 2016-162977 | 9/2016 |
| JP | 2018-157090 | 10/2018 |
| JP | 2019-050348 | 3/2019 |
| JP | 2020-096037 | 6/2020 |
| KR | 10-2008-0046275 | 5/2008 |
| KR | 10-2011-0104395 | 9/2011 |
| KR | 10-2017-0092285 | 8/2017 |
| KR | 10-2019-0135237 | 12/2019 |
| KR | 10-2020-0009360 | 1/2020 |
| WO | WO 2019/230524 | 12/2019 |

OTHER PUBLICATIONS

International Search Report dated Jan. 12, 2022 issued in Application No. PCT/KR2021/012807.

\* cited by examiner

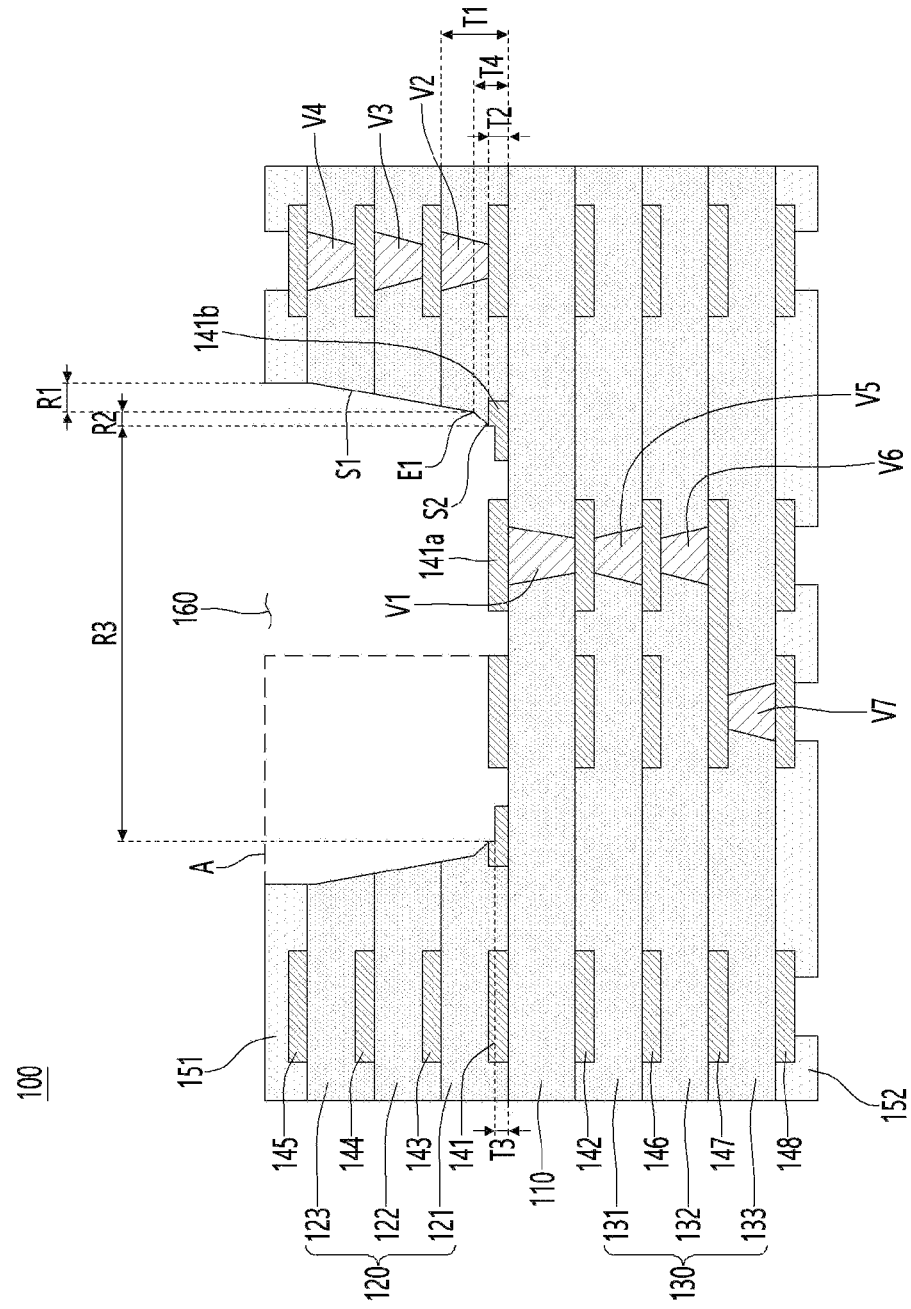
[FIG. 1a]

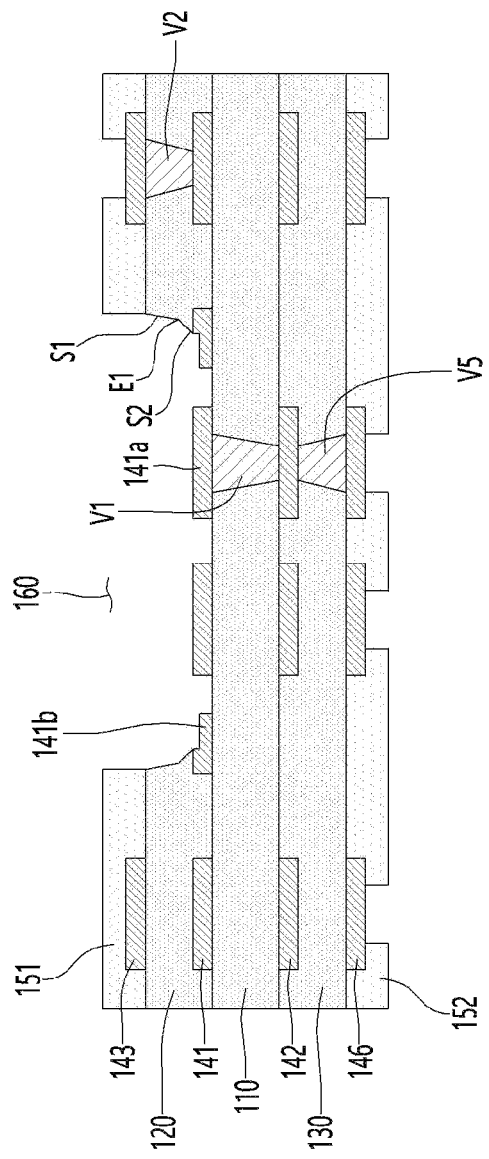

[FIG. 2a]
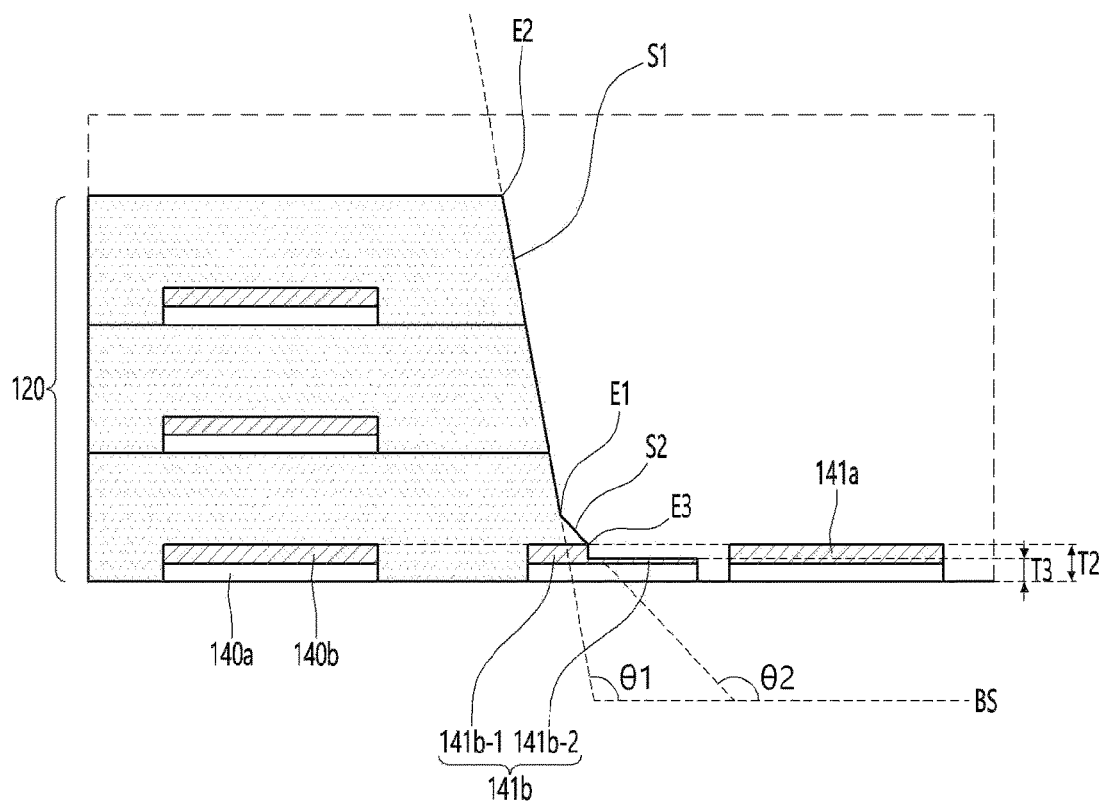
[FIG. 2b]
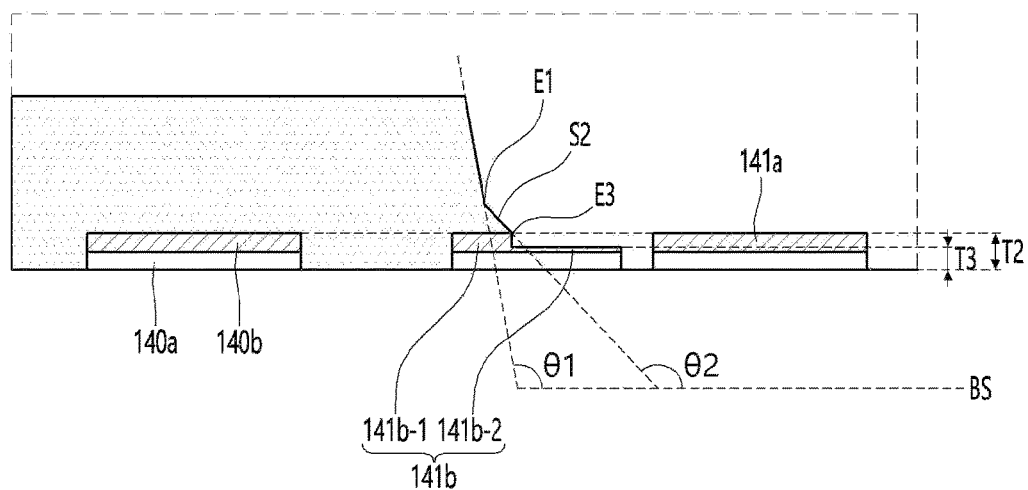

[FIG. 2c]
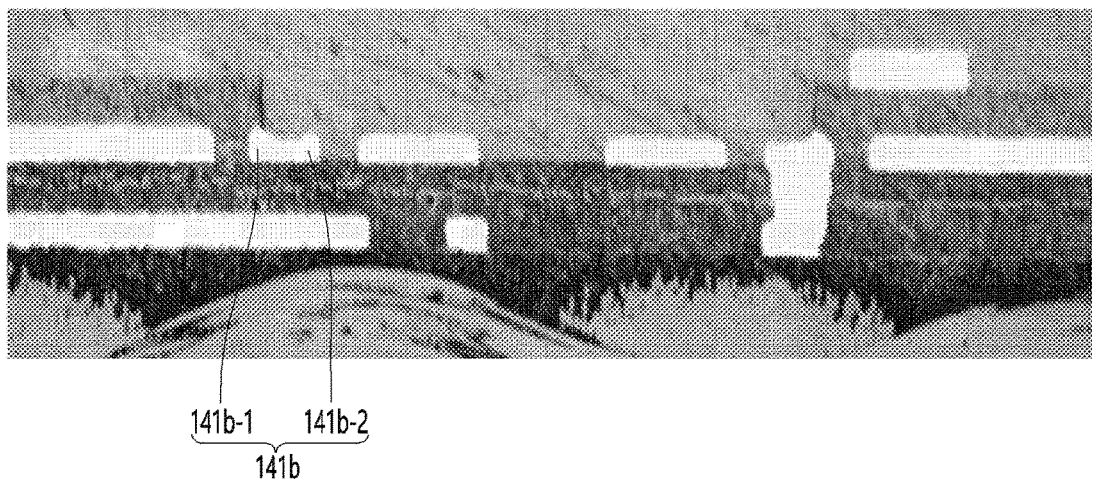

[FIG. 3]
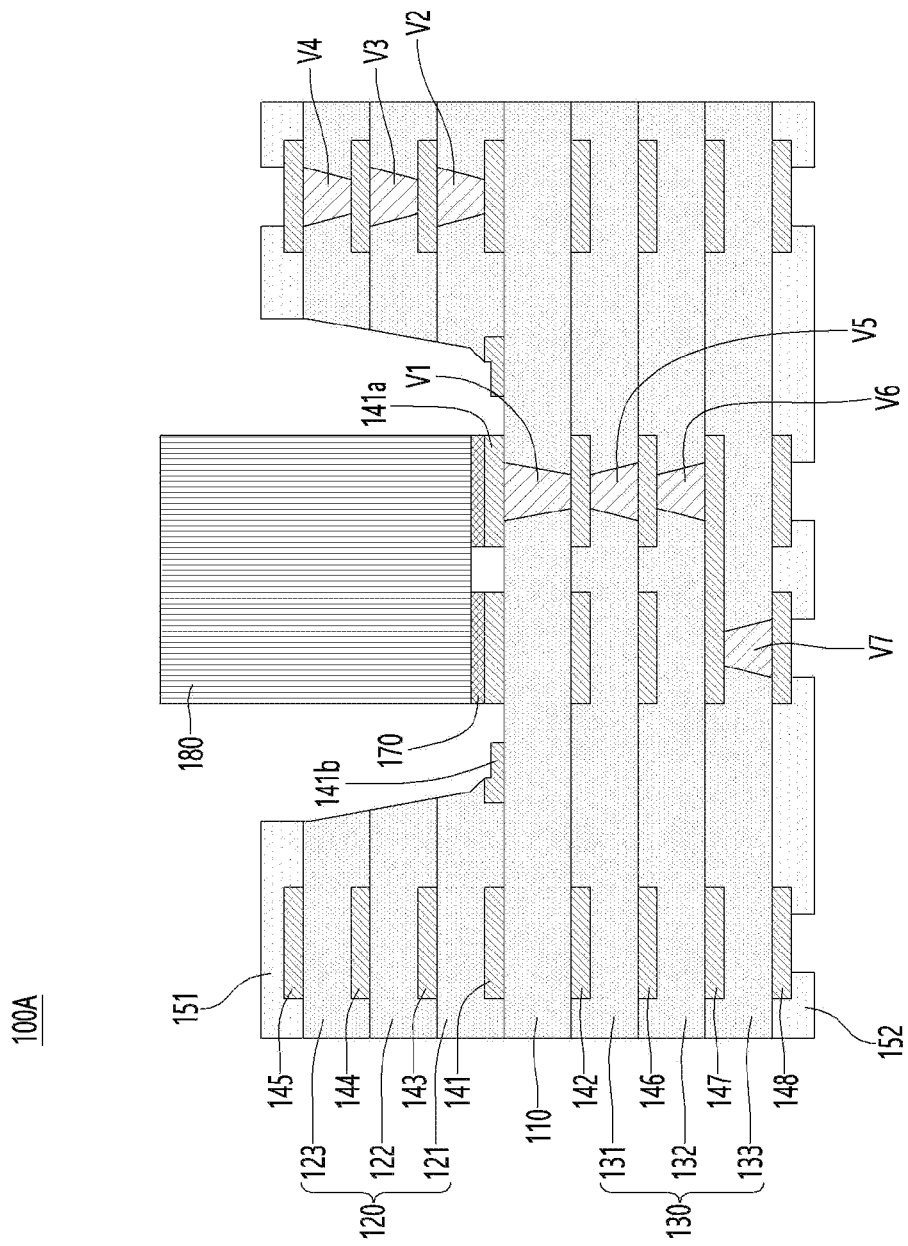

[FIG. 4]
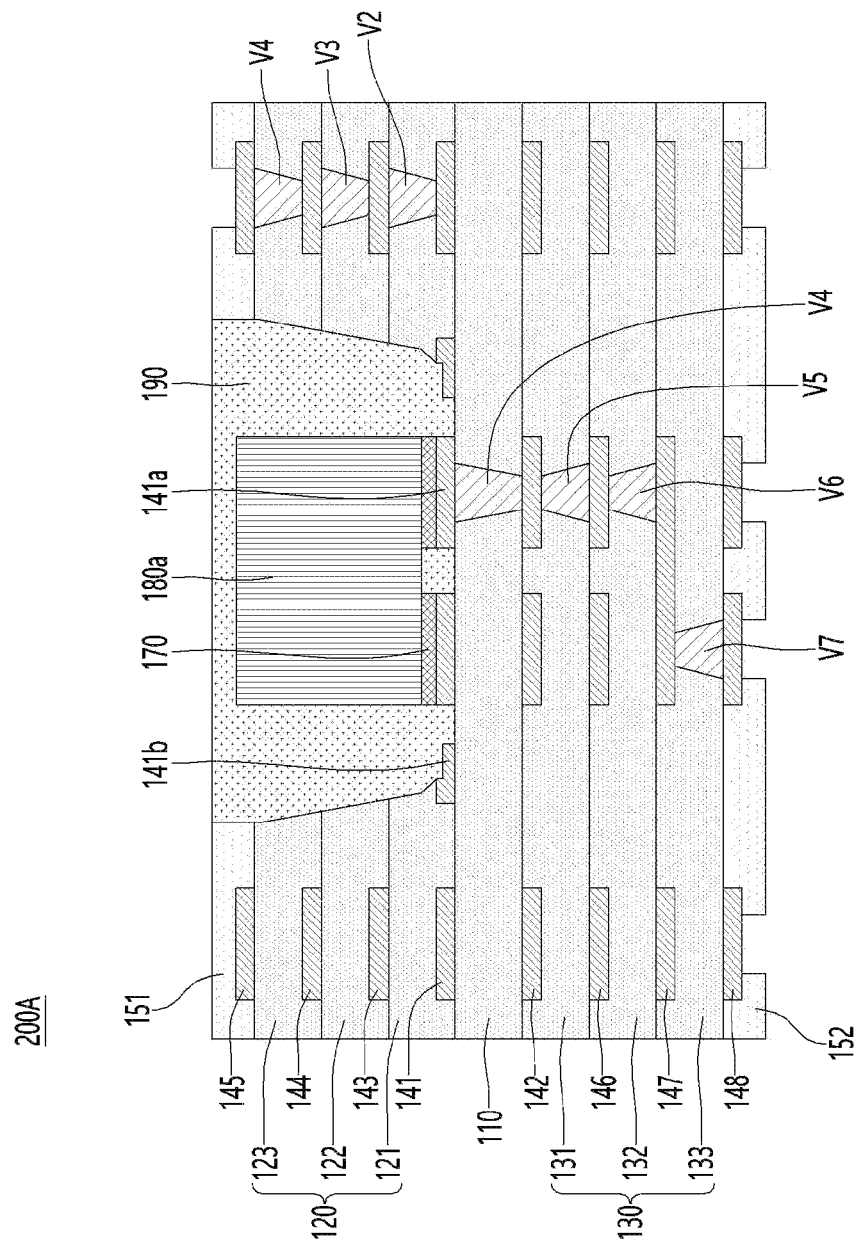

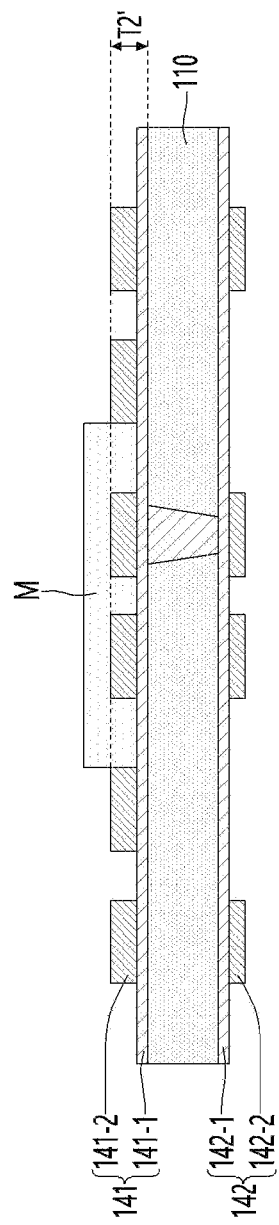
[FIG. 5]

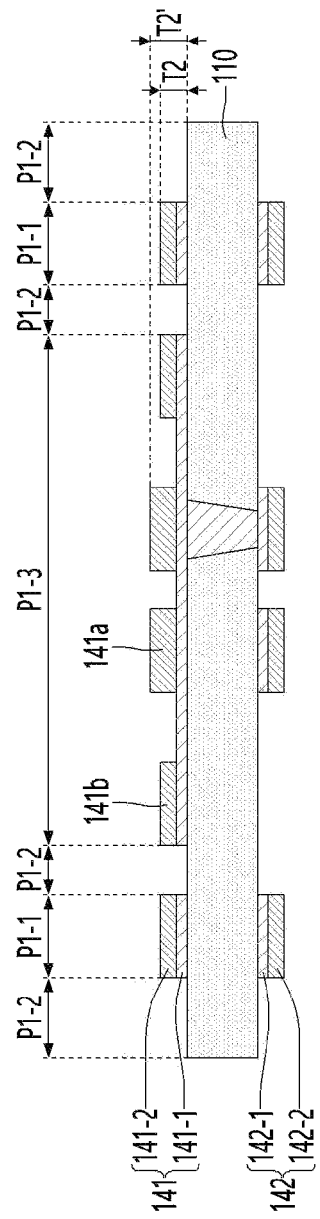
[FIG. 6]

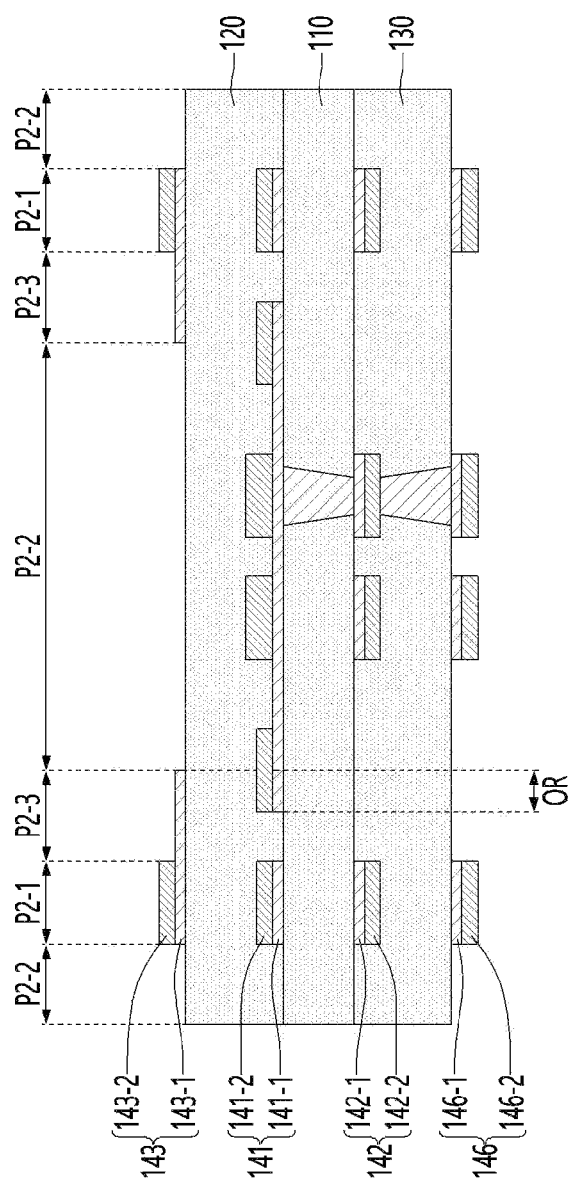
[FIG. 7]

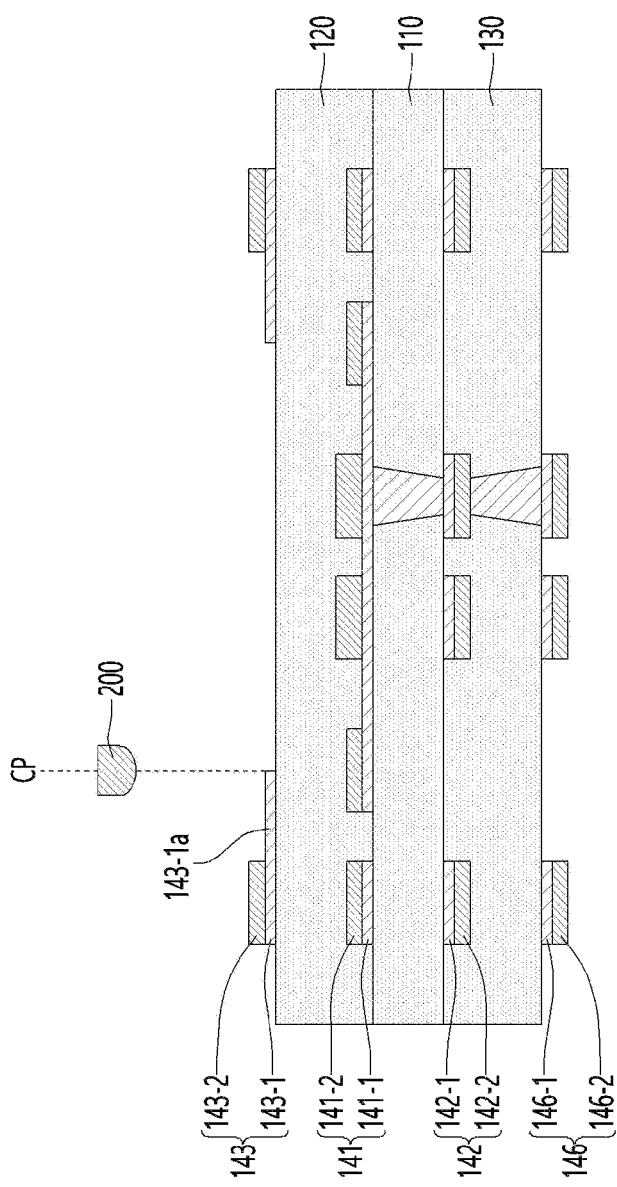
[FIG. 8]

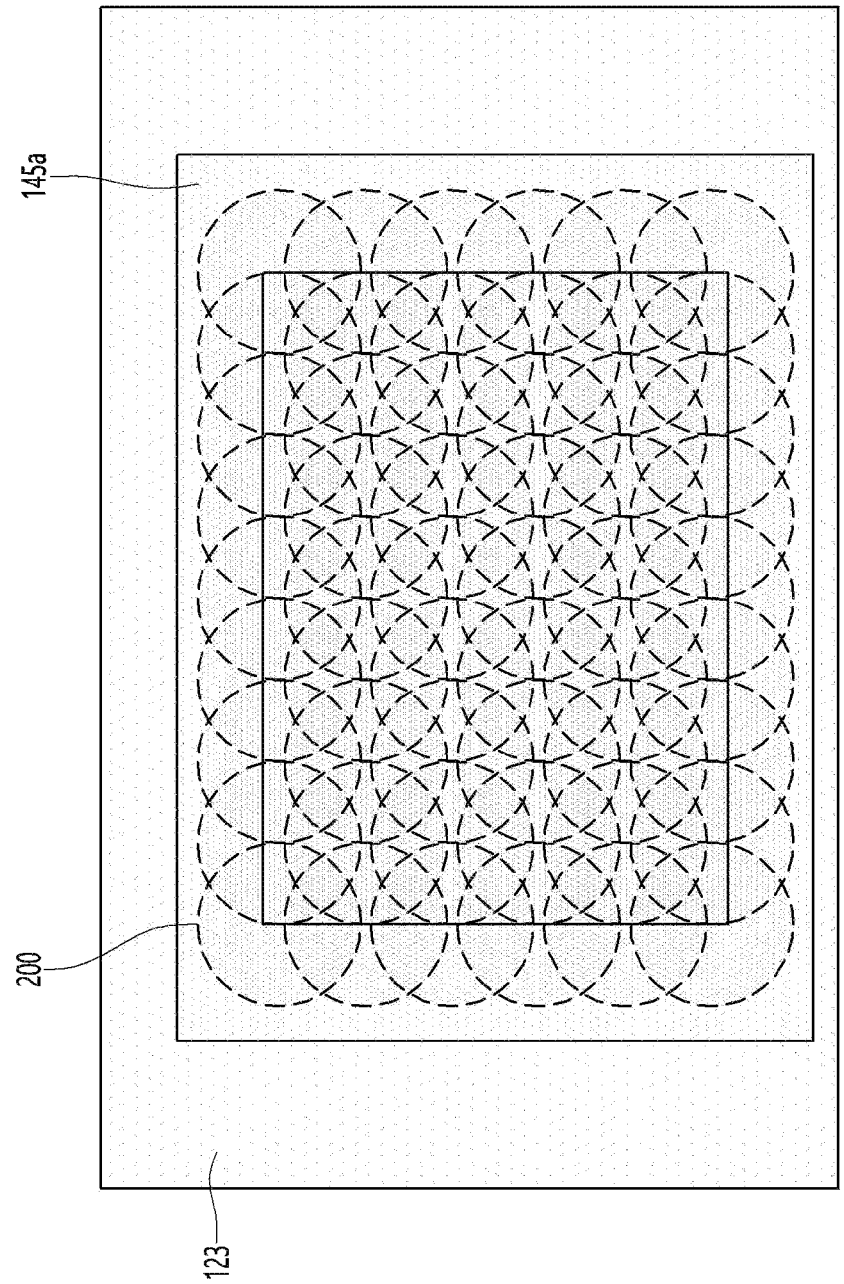

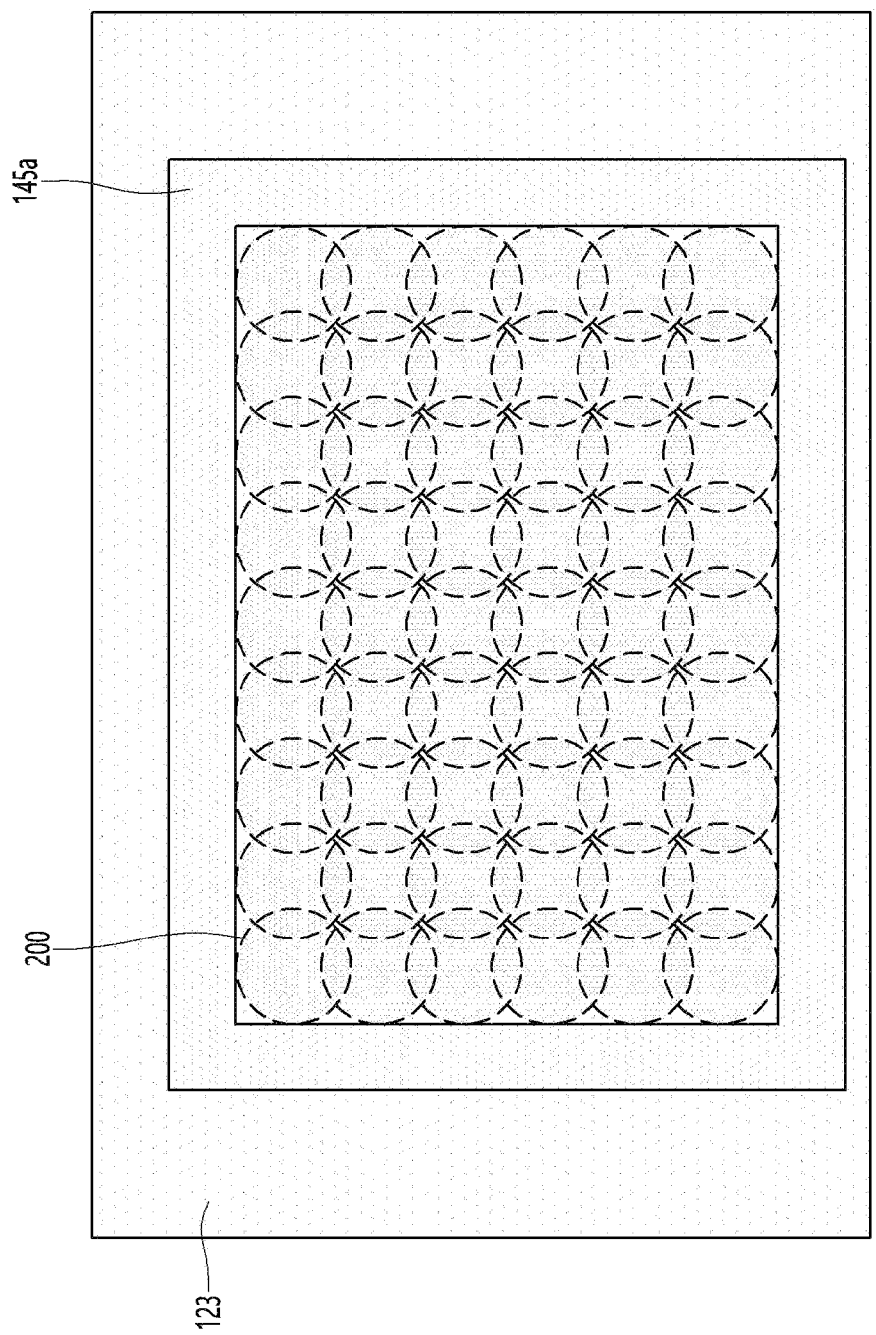

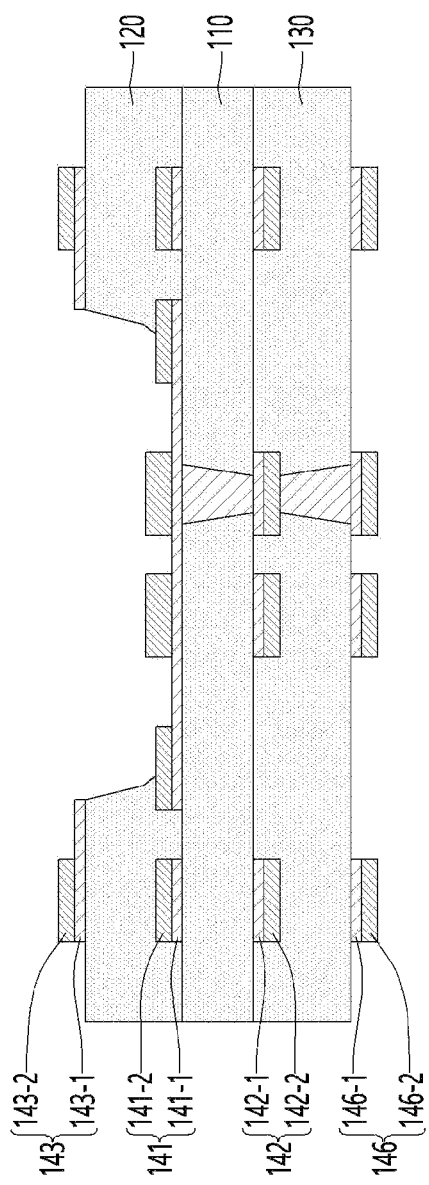
[FIG. 11]

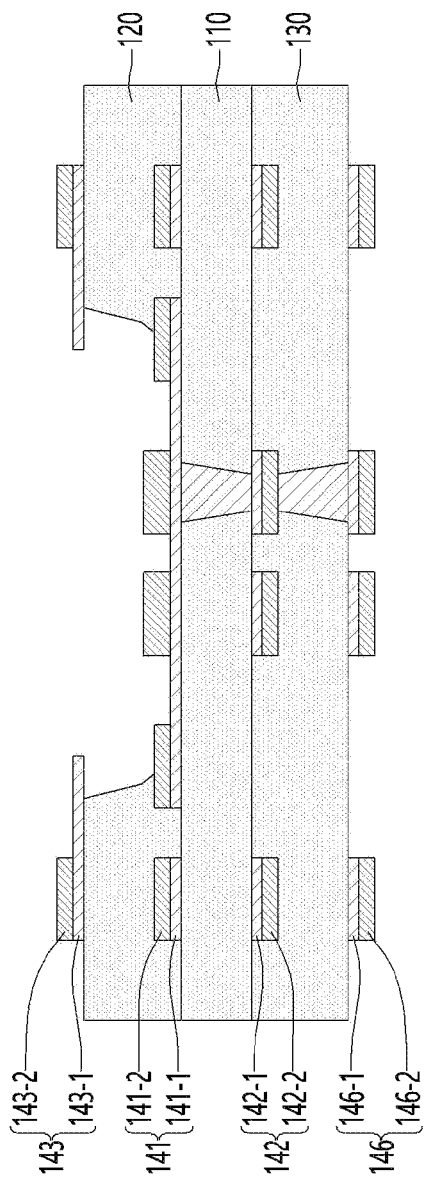

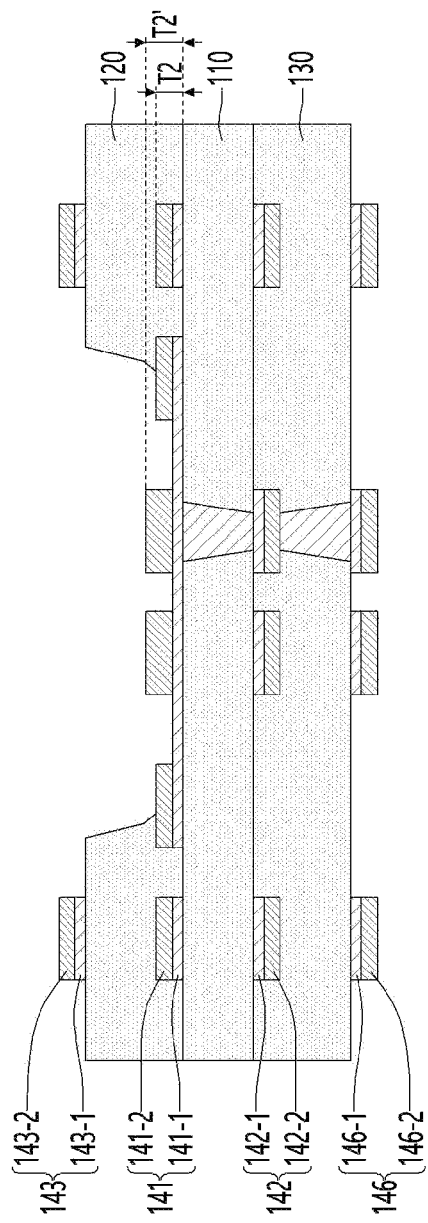
[FIG. 13]

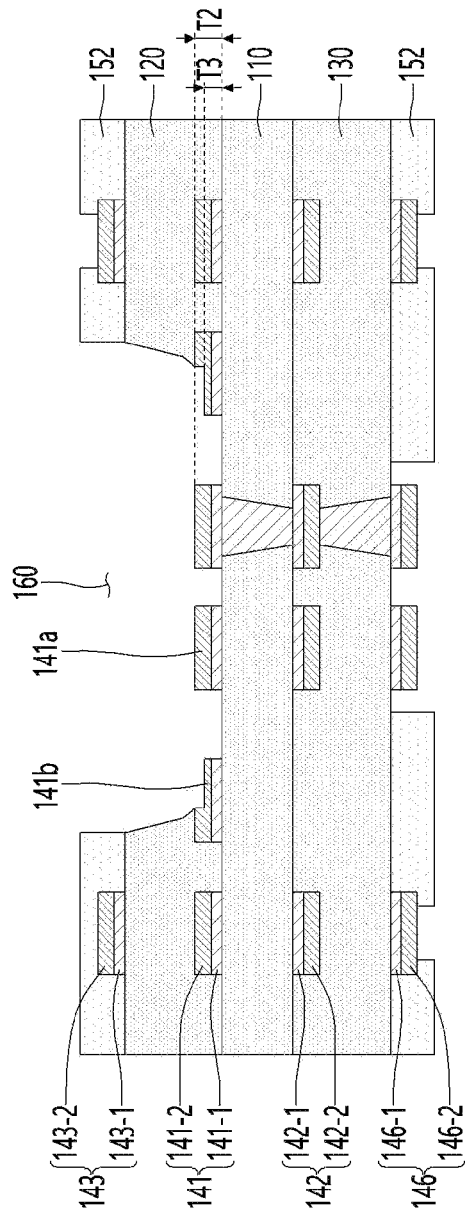
[FIG. 14]

CIRCUIT BOARD

CROSS-REFERENCE TO RELATED PATENT APPLICATIONS

This application is a U.S. National Stage Application under 35 U.S.C. § 371 of PCT Application No. PCT/KR2021/012807, filed Sep. 17, 2021, which claims priority to Korean Patent Application No. 10-2020-0120509, filed Sep. 18, 2020, whose entire disclosures are hereby incorporated by reference.

TECHNICAL FIELD

An embodiment relates to a circuit board and a package substrate including same.

BACKGROUND ART

A circuit board has a structure in which a mounting position of each device is determined and a circuit pattern connecting the device is printed on a surface of a flat plate in order to densely mount various kinds of devices on the flat plate, or it is composed of an embedded structure in which the device is embedded in the circuit board.

Recently, the circuit board is used in a multi-layered structure capable of high-density integration in order to realize miniaturization and multifunctionality of electronic components.

Generally, a conventional embedded circuit board forms a cavity for embedding a device using a drill bit, or subsidiary materials such as a release film are used to seat the device, or a cavity for embedding the device was formed using a sand blast.

However, an inclination angle of an inner wall of the cavity included in the conventional circuit board is formed at 150° or more with respect to a bottom surface of the cavity, the inclination angle of the inner wall must be considered in order to provide a mounting space for devices in the cavity, and accordingly, the space required for forming the cavity becomes relatively great. Accordingly, the conventional circuit board has a problem in that an integration density of circuits is reduced and an overall volume of the circuit board increases as the cavity formation space increases.

DISCLOSURE

Technical Problem

The embodiment provides a circuit board, a package substrate, and a method for manufacturing thereof capable of improving an inclination angle of an inner wall of a cavity.

In addition, the embodiment provides a circuit board, a package substrate, and a method for manufacturing thereof capable of forming a cavity having a desired depth in a desired region.

The technical problems to be achieved in the proposed embodiment are not limited to the technical problems mentioned above, and other technical problems not mentioned in the embodiments will be clearly understood by those of ordinary skill in the art to which the embodiments proposed from the description below.

Technical Solution

A circuit board according to an embodiment includes a first insulating layer; a first circuit pattern disposed on the first insulating layer; and a second insulating layer disposed on the first insulating layer and including a cavity, wherein an upper surface of the first insulating layer includes a first region that does not vertically overlap the cavity; a second region vertically overlapping the cavity; and a boundary region between the first region and the second region, the first circuit pattern includes a first-first circuit pattern disposed on the boundary region of the first insulating layer, the first-first circuit pattern includes a first portion that does not vertically overlap the cavity; and a second portion connected to the first portion and vertically overlapping the cavity, and a thickness of the first portion of the first-first circuit pattern is different from a thickness of the second portion of the first-first circuit pattern.

In addition, the thickness of the first portion of the first-first circuit pattern is greater than the thickness of the second portion of the first-first circuit pattern.

In addition, an upper surface of the second portion of the first-first circuit pattern is positioned lower than an upper surface of the first portion.

In addition, the first circuit pattern includes a first-second circuit pattern disposed in the second region on the upper surface of the first insulating layer; and a thickness of the first-second circuit pattern corresponds to the thickness of the first portion of the first-first circuit pattern.

In addition, the first circuit pattern includes a first-third circuit pattern disposed in the first region on the upper surface of the first insulating layer; and a thickness of the first-third circuit pattern corresponds to the thickness of the first portion of the first-first circuit pattern and the thickness of the first-second circuit pattern.

In addition, the first circuit pattern includes a first-first metal layer disposed on the first insulating layer; and a first-second metal layer disposed on the first-first metal layer, wherein a thickness of the first-first metal layer of the first portion of the first-first circuit pattern corresponds to a thickness of the first-first metal layer of the second portion of the first-first circuit pattern; and a thickness of the first-second metal layer of the first portion of the first-first circuit pattern is greater than a thickness of the first-second metal layer of the second portion of the first-first circuit pattern.

In addition, a difference between a thickness of the first portion and a thickness of the second portion of the first-first circuit pattern corresponds to a thickness of the first-first metal layer.

In addition, an inner wall of the cavity includes a first inner wall connected to an upper surface of the first-first circuit pattern and having a first inclination angle; and a second inner wall extending from the first inner wall and having a second inclination angle different from the first inclination angle.

In addition, the first inclination angle is greater than the second inclination angle.

In addition, the first inclination angle has a range of 130 degrees to 160 degrees, and the second inclination angle has a range of 92 degrees to 130 degrees.

In addition, a thickness of the second insulating layer has a range of 5 um to 20 um.

In addition, the second insulating layer includes RCC (Resin Coated Copper).

On the other hand, a package substrate according to an embodiment includes a first insulating layer; a second insulating layer disposed on the first insulating layer and including a cavity; a first-first circuit pattern and a first-second circuit pattern disposed on an upper surface of the first insulating layer; a connection portion disposed on the first-second circuit pattern; and an electronic device disposed on the connection portion, wherein the upper surface of the first insulating layer includes a first region covered by the second insulating layer; a second region exposed through the cavity of the second insulating layer; and a boundary region between the first region and the second region, the first-first circuit pattern is disposed on the boundary region, the first-second circuit pattern is disposed on the second region and exposed through the cavity; the first-first circuit pattern includes a first portion buried in the second insulating layer; and a second portion connected to the first portion and exposed through the cavity; and a thickness of the second portion is smaller than a thickness of the first portion.

In addition, the package substrate further includes a first-third circuit pattern disposed on the first region of the first insulating layer; and the thickness of the first portion of the first-first circuit pattern corresponds to a thickness of the first-second circuit pattern and a thickness of the first-third circuit pattern.

In addition, the first-first circuit pattern includes a first-first metal layer disposed on the first insulating layer; and a first-second metal layer disposed on the first-first metal layer, wherein a thickness of the first-first metal layer of the first portion of the first-first circuit pattern corresponds to a thickness of the first-first metal layer of the second portion of the first-first circuit pattern; and a thickness of the first-second metal layer of the first portion of the first-first circuit pattern is greater than a thickness of the first-second metal layer of the second portion of the first-first circuit pattern.

In addition, a difference between a thickness of the first portion and a thickness of the second portion of the first-first circuit pattern corresponds to a thickness of the first-first metal layer.

In addition, an inner wall of the cavity includes a first inner wall connected to an upper surface of the first-first circuit pattern and having a first inclination angle; and a second inner wall extending from the first inner wall and having a second inclination angle smaller than the first inclination angle.

In addition, a thickness of the second insulating layer has a range of 5 um to 20 um.

In addition, the second insulating layer includes RCC (Resin Coated Copper).

In addition, the package substrate further includes a molding layer disposed in the cavity and covering at least a part of the electronic device.

On the other hand, a method for manufacturing of the circuit board according to an embodiment includes preparing a first insulating layer including a first region, a second region, and a boundary region between the first region and the second region; forming a first circuit pattern including a first-first metal layer and a first-second metal layer obtained by plating the first-first metal layer as a seed layer on the first to third regions of the first insulating layer; forming a mask on a first circuit pattern disposed on the second region of the first insulating layer; etching and removing the first-first metal layer of the first circuit pattern disposed in the first region and the boundary region of the first insulating layer; forming a second insulating layer on one surface of the first insulating layer after removing the mask; forming a second circuit pattern including a second-first metal layer on one surface of the second insulating layer and a second-second metal layer obtained by plating the second-first metal layer as a seed layer on one surface of the second-first metal layer; removing a portion of the second-first metal layer of the second circuit pattern except for a second mask pattern adjacent to a cavity region; forming a cavity in the second insulating layer using the first-first metal layer and the second mask pattern of the second region; etching and removing the first-first metal layer in the second region; wherein the second insulating layer includes RCC (Resin Coated Copper), the first circuit pattern includes a first-first circuit pattern disposed on the boundary region of the first insulating layer; a first-second circuit pattern formed on the second region; and a first-third circuit pattern formed on the first region; the first-first circuit pattern may include a first portion buried in the second insulating layer; and a second portion connected to the first portion and exposed through the cavity; and a thickness of the second portion is smaller than a thickness of the first portion.

In addition, the thickness of the first portion of the first-first circuit pattern corresponds to a thickness of the first-second circuit pattern and a thickness of the first-third circuit pattern.

In addition, a thickness of the first-first metal layer of the first portion of the first-first circuit pattern corresponds to a thickness of the first-first metal layer of the second portion of the first-first circuit pattern, wherein a thickness of the first-second metal layer of the first portion of the first-first circuit pattern is greater than a thickness of the first-second metal layer of the second portion of the first-first circuit pattern, and a difference between a thickness of the first portion and a thickness of the second portion of the first-first circuit pattern corresponds to a thickness of the first-first metal layer.

In addition, an inner wall of the cavity includes a first inner wall connected to an upper surface of the first-first circuit pattern and having a first inclination angle; and a second inner wall extending from the first inner wall and having a second inclination angle smaller than the first inclination angle.

Advantageous Effects

The embodiment enables processing of a cavity in an insulating layer using a part of a circuit pattern. That is, the embodiment uses a part of the circuit pattern as a stop layer or mask for laser processing. Accordingly, it is not necessary to separately form a stop layer or mask during cavity processing using a laser, so that it can achieve process simplification and product cost reduction.

In addition, the cavity of the circuit board in the embodiment includes an inner wall. In this case, the inner wall of the cavity includes a first portion having a first inclination angle, and a second portion extending to the first portion and having a second inclination angle. In this case, the first inclination angle and the second inclination angle are different from each other. In other words, the inner wall of the cavity in the embodiment may include an inflection point at which an inclination angle changes between the first portion and the second portion. In this case, each of the first inclination angle and the second inclination angle may mean an interior angle with an upper surface of the first insulating layer exposed through the cavity. In addition, the first inclination angle may be smaller than the second inclination angle. Preferably, the second portion of the inner wall constituting an outermost portion of the cavity in the embodiment has a second inclination angle, and the first portion of the inner wall may have a first inclination angle greater than the second inclination angle. In the above embodiment, the inclination angle of the second portion of the inner wall can be reduced compared to the comparative example, a space required for forming the cavity can be minimized compared to the comparative example in a case where a same device is disposed, so that an integration density of the circuit may be improved. In other words, the embodiment may allow more circuits to be formed than the comparative example within the same area by reducing the inclination angle of the second portion of the inner wall, and thus an overall volume of the circuit board can be reduced.

In addition, the package substrate of the embodiment includes a molding layer disposed in the cavity. In this case, the first portion and the second portion of the inner wall of the cavity are disposed in contact with the molding layer. In this case, the first portion and the second portion of the inner wall of the cavity may have different inclination angles based on an inflection point rather than a single inclination angle. The structure of the cavity according to the embodiment described above can increase a surface area in contact with the molding layer, thereby improving the adhesion between the molding layer and the circuit board.

In addition, the embodiment allows a cavity to be formed through laser processing using a circuit pattern. For example, when forming a cavity using a laser, it requires a first mask pattern in a lower region of the cavity to determine a depth of the cavity, and a second mask pattern in an upper region of the cavity to surround the cavity and determine an upper width of the cavity. In this case, the comparative example allows providing the first mask pattern and the second mask pattern using separate metal layers. In contrast, the embodiment allows the use of a circuit pattern or a seed layer used to form the circuit pattern as the first mask pattern and the second mask pattern. In this case, at least a portion of the first mask pattern and the second mask pattern overlap in a vertical direction. That is, the first mask pattern and the second mask pattern of the comparative example are arranged so as not to overlap each other in the vertical direction. Accordingly, laser processing is performed to an area outside the second mask pattern due to a process deviation during laser processing in the comparative example, and accordingly, a problem of processing a part of the first insulating layer may occur. In contrast, the embodiment arranges the first mask pattern and the second mask pattern to partially overlap as described above, so that a cavity can be precisely processed in a cavity processing region, and thus reliability can be improved.

In addition, the embodiment allows an upper surface of a stop layer formed in a lower region of the cavity to have a step. For example, the circuit pattern used as the stop layer may include a first portion disposed in the second insulating layer and a second portion extending from the first portion and exposed through the cavity. A thickness of the first portion of the circuit pattern may be different from a thickness of the second portion. For example, the thickness of the second portion may be smaller than that of the first portion. That is, the second portion of the circuit pattern is etched in two stages, and thus has a thickness smaller than that of other circuit patterns. As described above, the embodiment may allow the second portion of the circuit pattern exposed through the cavity to have a thickness smaller than that of other portions, so that it can prevent an area of the cavity from being reduced by the second portion, thereby improving reliability.

DESCRIPTION OF DRAWINGS

FIG. 1a is a view showing a circuit board according to a first embodiment.

FIG. 1b is a view showing a circuit board according to a second embodiment.

FIG. 2a is an enlarged view of a cavity region of FIG. 1a.
FIG. 2b is an enlarged view of a cavity region of FIG. 1b.
FIG. 2c is a view showing a picture of a product including a mask pattern according to an embodiment.
FIG. 3 is a view showing a package substrate according to a first embodiment.
FIG. 4 is a view showing a package substrate according to a second embodiment.
FIGS. 5 to 14 are views showing a method of manufacturing the circuit board shown in FIG. 2a in order of process.

DETAILED DESCRIPTION OF THE EMBODIMENTS

Hereinafter, preferred embodiments of the present invention will be described in detail with reference to the accompanying drawings.

However, the technical spirit of the present invention is not limited to some embodiments described, but may be implemented in various different forms, and, as long as it is within the scope of the technical spirit of the present invention, one or more of the components may be selectively combined and substituted between the embodiments.

In addition, terms (including technical and scientific terms) used in the embodiments of the present invention may be interpreted as meanings that can be generally understood by those of ordinary skill in the art to which the present invention pertains unless explicitly defined and described, and the meanings of commonly used terms such as predefined terms may be interpreted in consideration of the contextual meaning of the related art. In addition, the terms used in the embodiments of the present invention are for describing the embodiments and are not intended to limit the present invention.

In this specification, the singular may also include the plural unless specifically stated in the phrase, and when it is described as "A and (and) at least one (or more than one) of B and C", it may include one or more of all combinations that can be combined with A, B, and C. In addition, in describing the components of the embodiment of the present invention, terms such as first, second, A, B, (a), (b), etc. may be used.

These terms are only used to distinguish the component from other components, and are not limited to the essence, order, or order of the component by the term. And, when it is described that a component is 'connected', 'coupled' or 'contacted' to another component, the component is not only directly connected, coupled or contacted to the other component, but also with the component it may also include a case of 'connected', 'coupled' or 'contacted' due to another element between the other elements.

In addition, when it is described as being formed or disposed on "above (on) or below (under)" of each component, the above (on) or below (under) is one as well as when two components are in direct contact with each other. Also includes a case in which another component as described above is formed or disposed between two components. In addition, when expressed as "above (up) or below (under)", it may include not only the upward direction but also the meaning of the downward direction based on one component.

Hereinafter, an embodiment of the present invention will be described in detail with reference to the accompanying drawings.

FIG. 1a is a view showing a circuit board according to a first embodiment, FIG. 1b is a view showing a circuit board according to a second embodiment, FIG. 2a is an enlarged view of a cavity region of FIG. 1a, FIG. 2b is an enlarged view of a cavity region of FIG. 1b, and FIG. 2c is a view showing a picture of a product including a mask pattern according to an embodiment.

Referring to FIGS. 1a, 1b, 2a, 2b, and 2c, a circuit board 100 includes a first insulating layer 110, a second insulating layer 120, a third insulating layer 130, circuit patterns 141, 141, 143, 144, 145, 146, 147, 148, vias V1, V2, V3, V4, V5, V6, V7, and protective layers 151 and 152.

A first insulating layer 110 may be an insulating layer disposed in a center of the circuit board 100.

A second insulating layer 120 is disposed on the first insulating layer 110.

In addition, a third insulating layer 130 is disposed under the first insulating layer 110.

In this case, the first insulating layer 110 is illustrated as being disposed in a center layer in an entire laminated structure of the circuit board 100 in the drawing, but the embodiment is not limited thereto. That is, the first insulating layer 110 may be disposed at a position biased toward an upper side in the entire laminated structure of the circuit board 100, or, conversely, may be disposed at a position biased toward a lower side.

Here, referring to FIG. 1a, the second insulating layer 120 is disposed on the first insulating layer 110. In this case, the second insulating layer 120 has a plurality of layer structures. For example, the second insulating layer 120 may be included a second-first insulating layer 121 disposed on an upper surface of the first insulating layer 110, a second-second insulating layer 122 disposed on an upper surface of the second-first insulating layer 121, and a second-third insulating layer 123 disposed on an upper surface of the second-second insulating layer 122. In this case, it is illustrated that the second insulating layer 120 has a three-layer structure in the drawings, but the embodiment is not limited thereto. That is, the second insulating layer 120 may be composed of two or less layers, or alternatively, it may be composed with a structure of four or more layers.

In addition, referring to FIG. 1a, a third insulating layer 130 is disposed under the first insulating layer 110. In this case, the third insulating layer 130 has a multi-layer structure. For example, the third insulating layer 130 may include a third-first insulating layer 131 disposed under a lower surface of the first insulating layer 110, a third-second insulating layer 132 disposed under a lower surface of the third-first insulating layer 131, and a third-third insulating layer 133 disposed under a lower surface of the third-second insulating layer 132. In this case, it is illustrated that the third insulating layer 130 has a three-layer structure in the drawings, but the embodiment is not limited thereto. That is, the second insulating layer 130 may be composed with two or less layers, or alternatively, may be composed with a structure of four or more layers.

In addition, the circuit board 100 is illustrated as having a seven-layer structure based on the insulating layer in the drawings, but the embodiment is not limited thereto. For example, the circuit board 100 may have a number of layers of 6 or less based on the insulating layer, or alternatively, may have a number of layers of 8 or more.

Meanwhile, the second insulating layer 120 and the third insulating layer 130 have been described as having a multi-layer structure in FIG. 1a, but are not limited thereto. For example, the second insulating layer 120 and the third insulating layer 130 may be composed of a single layer.

That is, the second insulating layer 120 is disposed as one layer on the upper surface of the first insulating layer 110, and the third insulating layer 130 may be disposed as one layer on the lower surface of the first insulating layer 110 as shown in FIG. 1b.

Accordingly, a cavity (to be described later) is formed in the second insulating layer 120 composed of a plurality of layers in FIG. 1a, and thus the cavity may have a plurality of layer structure.

In addition, a cavity may be formed in the second insulating layer 120 composed of a single layer in FIG. 1b.

That is, a difference between a first embodiment in FIG. 1a and a second embodiment in FIG. 1b is whether a second insulating layer is composed of a plurality of layers or a single layer. In addition, a difference between a first embodiment in FIG. 1a and a second embodiment in FIG. 1b is whether the cavity formed in the second insulating layer is formed by processing a plurality of layers or a single layer.

In other words, the second insulating layer 120 in an embodiment may be composed of a plurality of layers, or may be composed of a single layer differently. In addition, a cavity may be formed in the second insulating layer 120 of the plurality of layers or the single layer.

The first insulating layer 110, the second insulating layer 120, and the third insulating layer 130 are substrates on which an electric circuit capable of changing wiring is formed, and it may include a printed circuit board and an insulating substrate made of an insulating material capable of forming circuit patterns on the surface thereof.

For example, the first insulating layer 110 may be rigid or flexible. For example, the first insulating layer 110 may include glass or plastic. Specifically, the first insulating layer 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

In addition, the first insulating layer 110 may include an optically isotropic film. As an example, the first insulating layer 110 may include cyclic olefin copolymer (COC), cyclic olefin polymer (COP), optically isotropic PC, optically isotropic polymethylmethacrylate (PMMA), or the like.

In addition, the first insulating layer 110 may be partially bent while having a curved surface. That is, the first insulating layer 110 may partially have a plane and may partially be bent while having a curved surface. Specifically, an end portion of the first insulating layer 110 may be bent while having a curved surface, or bent or crooked while having a surface with a random curvature.

In addition, the first insulating layer 110 may be a flexible substrate having flexibility. In addition, the first insulating layer 110 may be a curved or bent substrate.

Meanwhile, the second insulating layer 120 and the third insulating layer 130 may be composed of RCC.

That is, each of the second insulating layer 120 and the third insulating layer 130 composed of a plurality of layers in the first embodiment may be composed of RCC.

In addition, a single layer of each of the second insulating layer 120 and the third insulating layer 130 in the second embodiment may be composed of RCC.

Accordingly, the second insulating layer 120 and the third insulating layer 130 may have a thickness of 5 μm to 20 μm. For example, when the second insulating layer 120 has a multi-layer structure, each of the plurality of layers may have a thickness of 5 μm to 20 μm. In addition, when the second insulating layer 120 has a single layer, the thickness of the single layer of the second insulating layer 120 may be 5 μm to 20 μm.

That is, an insulating layer constituting a circuit board in the comparative example was composed of a prepreg (PPG) containing glass fibers. In this case, it is difficult to reduce a thickness of the glass fiber based on the PPG of the circuit board in the comparative example. This is because, when the thickness of the PPG decreases, the glass fiber included in the PPG may be electrically connected to a circuit pattern disposed on a surface of the PPG, and thus a crack risk is induced. Accordingly, when reducing the thickness of PPG on the circuit board in the comparative example, it causes dielectric breakdown and damage to circuit patterns. Accordingly, the circuit board in the comparative example had a limit in reducing an overall thickness due to the thickness of the glass fibers constituting the PPG.

In addition, the circuit board in the comparative example is composed of an insulating layer made of only PPG containing glass fibers, and thus has a high dielectric constant. However, there is a problem that it is difficult to use for high frequency in the case of a dielectric having a high dielectric constant. That is, the circuit board of the comparative example has a high dielectric constant of glass fibers, and this causes a phenomenon in which the dielectric constant is destroyed in the high frequency band.

Accordingly, the embodiment configures the insulating layer using the low dielectric constant RCC, thereby reducing the thickness of the circuit board and providing a highly reliable circuit board in which signal loss is minimized even in a high frequency band.

Meanwhile, the embodiment allows the second insulating layer 120 to be made of RCC, and thus, the thickness of the circuit board can be significantly reduced compared to the comparative example made of PPG. Accordingly, the embodiment can reduce the thickness of the circuit board by at least 5 μm compared to the comparative example by using the RCC made of a low dielectric constant material.

However, even when using an RCC having a low dielectric constant of 2.7, which is 10% improved from the level of 3.0, which is the dielectric constant of PPG, the decrease in thickness is only 10% compared to the comparative example. Accordingly, the embodiment can reduce the thickness of the circuit board of the printed circuit board by at least 5 μm compared to the comparative example by using the RCC made of a low dielectric constant material.

In this case, at least one of the first insulating layer 110, the second insulating layer 120, and the third insulating layer 130 expresses the electrical wiring connecting the circuit components based on the circuit design as a wiring diagram, and may reproduce an electrical conductor on insulators. In addition, at least one of the first insulating layer 110, the second insulating layer 120, and the third insulating layer 130 may mount an electric component and form a wiring connecting them in a circuit manner, and may mechanically fix parts other than their electrical connection function.

Circuit patterns may be disposed on surfaces of the first insulating layer 110, the second insulating layer 120, and the third insulating layer 130. For example, when the second insulating layer 120 is formed of a single layer, a circuit pattern 143 may be disposed on an upper surface of the single layer of the second insulating layer 120.

In addition, when the second insulating layer 120 is composed of a plurality of layers, a first circuit pattern 141 may be disposed on an upper surface of the first insulating layer 110. In this case, a plurality of first circuit patterns 141 may be disposed on the upper surface of the first insulating layer 110 while spaced apart from each other by a predetermined distance.

A second circuit pattern 142 may be disposed under a lower surface of the first insulating layer 110. A plurality of second circuit patterns 142 may be disposed on the lower surface of the first insulating layer 110 while spaced apart from each other by a predetermined distance.

In addition, circuit patterns may be disposed on a surface of the second insulating layer 120. For example, a plurality of third circuit patterns 143 may be disposed on an upper surface of the second-first insulating layer 121 to be spaced apart from each other by a predetermined distance. In addition, a plurality of fourth circuit patterns 144 may be disposed on an upper surface of the second-second insulating layer 122 to be spaced apart from each other by a predetermined distance. In addition, a plurality of fifth circuit patterns 145 may be disposed on an upper surface of the second-third insulating layer 123 to be spaced apart from each other by a predetermined distance.

In addition, circuit patterns may be disposed on a surface of the third insulating layer 130. For example, when the third insulating layer 130 is formed of a single layer, a sixth circuit pattern 146 may be disposed on a lower surface of the single layer of the third insulating layer 130.

In addition, when the third insulating layer 130 is composed of a plurality of layers, a plurality of sixth circuit patterns 146 may be disposed on the lower surface of the third-first insulating layer 131 to be spaced apart from each other by a predetermined distance. In addition, a plurality of seventh circuit patterns 147 may be disposed on the lower surface of the third-second insulating layer 132 to be spaced apart from each other by a predetermined distance. In addition, a plurality of eighth circuit patterns 148 may be disposed on the lower surface of the third-third insulating layer 133 to be spaced apart from each other by a predetermined distance.

Meanwhile, the first to eighth circuit patterns 141, 142, 143, 144, 145, 146, 147, and 148 as described above are wirings that transmit electrical signals, and may be formed of a metal material having high electrical conductivity. To this end, the first to eighth circuit patterns 141, 142, 143, 144, 145, 146, 147, and 148 may be formed of at least one metal material selected from gold (Au), silver (Ag), platinum (Pt), titanium (Ti), tin (Sn), copper (Cu), and zinc (Zn). In addition, the first to eighth circuit patterns 141, 142, 143, 144, 145, 146, 147, and 148 may be formed of a paste or solder paste including at least one metal material selected from gold (Au), silver (Ag), platinum (Pt), titanium (Ti), tin (Sn), copper (Cu), and zinc (Zn) having excellent bonding strength. Preferably, the first to eighth circuit patterns 141, 142, 143, 144, 145, 146, 147, and 148 may be formed of copper (Cu), which has high electrical conductivity and is relatively inexpensive.

The first to eighth circuit patterns 141, 142, 143, 144, 145, 146, 147, and 148 may be formed by an additive process, a subtractive process, a modified semi additive process (MSAP) and a semi additive process (SAP) method, which is a typical circuit board manufacturing process, and a detailed description thereof will be omitted herein.

The first circuit pattern 141 can be roughly divided into three patterns according to positions.

For example, the first circuit pattern 141 may include a first-first circuit pattern. The first circuit pattern 141 may mean a first mask pattern 141b described below. That is, a part of the first-first circuit pattern may be buried in the second insulating layer 120 and a remaining part may be exposed through the cavity 160. That is, an upper surface of the first-first circuit pattern may have a step. That is, the first-first circuit pattern may be positioned in a boundary region where the cavity 160 is formed. Hereinafter, the first-first circuit pattern will be described as a first mask pattern 141b.

In addition, the first circuit pattern 141 may include a first-second circuit pattern. The first-second circuit pattern may be exposed through the cavity 160. That is, the first-second circuit pattern may be formed in a region where the cavity 160 is formed. The first-second circuit pattern may also be referred to as a pad 141a. Hereinafter, the first-second circuit pattern will be described as a pad 141a.

In addition, the first circuit pattern 141 may include a first-third circuit pattern. The first-third circuit pattern may be disposed on an upper surface of the first insulating layer 110 and covered by the second insulating layer 120.

In other words, the first circuit pattern 141 includes first-first to first-third circuit patterns according to an arrangement position. The first-second circuit pattern may be formed in a region vertically overlapping the cavity 160 on the upper surface of the first insulating layer 110. In addition, the first-third circuit pattern may be formed in a region that does not vertically overlap the cavity 160 on the upper surface of the first insulating layer 110. In addition, the first-first circuit pattern may vertically overlap an inner wall of the cavity 160. Accordingly, a part of the first-first circuit pattern may vertically overlap the cavity 160 and a remaining part of the first-first circuit pattern may not vertically overlap the cavity 160.

Hereinafter, the first mask pattern 141b and the pad 141a corresponding to the first-first circuit pattern and the first-second circuit pattern will be described in detail.

The first circuit pattern 141 may include a pad 141a vertically overlapping the cavity 160 while being disposed on an upper surface of the first insulating layer 110. The pad 141a may be electrically connected to an electronic device (to be described later) mounted in the cavity 160. For example, the pad 141a may be a wire bonding pad connected to an electronic device mounted in the cavity 160 through a wire. Alternatively, the pad 141a may be a flip chip bonding pad directly connected to a terminal of an electronic device mounted in the cavity 160. This will be described in more detail below.

In addition, the first circuit pattern 141 may include a first mask pattern 141b disposed on the upper surface of the first insulating layer 110 and partially vertically overlapping the cavity 160. For example, a portion of the first mask pattern 141b may be covered with the second insulating layer 120.

The first mask pattern 141b may include a first portion 141b-1 that does not vertically overlap with the cavity 160 (eg, covered with the second insulating layer 120) and the cavity 160 and a second portion 141b-2 vertically overlapping the cavity 160 (eg, exposed through the cavity).

In addition, the first portion 141b-1 and the second portion 141b-2 of the first mask pattern 141b may have different thicknesses. For example, a thickness of the first portion 141b-1 of the first mask pattern 141b may be greater than a thickness of the second portion 141b-2. That is, the first portion 141b-1 of the first mask pattern 141b may be formed through a single etching process. In addition, the second portion 141b-2 of the first mask pattern 141b may be formed through two etching processes. Accordingly, the second portion 141b-2 of the first mask pattern 141b may have a thinner thickness than the first portion 141b-1 as an additional etching process progress.

Accordingly, an upper surface of the first mask pattern 141b may have a step. In addition, the second portion 141b-2 of the first mask pattern 141b exposed through the cavity 160 may have a thickness smaller than a thickness of the first portion 141b-1, and accordingly, it does not affect mounting of electronic devices in the cavity 160. Accordingly, the embodiment can improve reliability even in a structure including the first mask pattern 141b.

The first mask pattern 141b will be described in more detail below.

Meanwhile, each of the first to eighth circuit patterns 141, 142, 143, 144, 145, 146, 147, and 148 may include a pattern connected to a via for interlayer conduction, a pattern for signal transmission, and a pad connected to an electronic device and the like.

Vias V1, V2, V3, V4, V5, V6, and V7 that electrically connect circuit patterns disposed on different layers to each other may be disposed in the first insulating layer 110, the second insulating layer 120, and the third insulating layer 130. The vias V1, V2, V3, V4, V5, V6, and V7 may be disposed to pass through at least one of the first insulating layer 110, the second insulating layer 120, and the third insulating layer 130. In addition, both ends of the vias V1, V2, V3, V4, V5, V6, and V7 are respectively connected to circuit patterns disposed on different insulating layers, and thus it can transmit an electrical signal.

A first via V1 may be disposed in the first insulating layer 110. The first via V1 may be disposed to pass through upper and lower surfaces of the first insulating layer 110. The first via V1 may electrically connects the first circuit pattern 141 disposed on the upper surface of the first insulating layer 110 and the second circuit pattern 142 disposed on the lower surface of the first insulating layer 110.

A plurality of vias may be disposed in the second insulating layer 120. That is, the second via V2 may be disposed in the second-first insulating layer 121. The second via V2 may be electrically connected the first circuit pattern 141 disposed on the upper surface of the first insulating layer 110 and the third circuit pattern 143 disposed on the upper surface of the second-first insulating layer 121.

In addition, a third via V3 may be disposed in the second-second insulating layer 122. The third via V3 may be electrically connected the fourth circuit pattern 144 disposed on the upper surface of the second-second insulating layer 122 and the third circuit pattern 143 disposed on the upper surface of the second-first insulating layer 121.

In addition, a fourth via V4 may be disposed in the second-third insulating layer 123. The fourth via V4 may be electrically connected the fifth circuit pattern 145 disposed on the upper surface of the second-third insulating layer 123 and the fourth circuit pattern 144 disposed on the upper surface of the second-second insulating layer 122.

In addition, when the second insulating layer 120 is formed of a single layer, only the second via V2 may be disposed in the single layer of the second insulating layer 120.

A plurality of vias may be disposed in the third insulating layer 130. That is, a fifth via V5 may be disposed in the third-first insulating layer 131. The fifth via V5 may be electrically connected the second circuit pattern 142 disposed on the lower surface of the first insulating layer 110 and the sixth circuit pattern 146 disposed on the lower surface of the third-first insulating layer 131.

In addition, a sixth via V6 may be disposed in the third-second insulating layer 132. The sixth via V6 may be electrically connected the seventh circuit pattern 147 disposed on the lower surface of the third-second insulating layer 132 and the sixth circuit pattern 146 disposed on the lower surface of the third-first insulating layer 131.

Also, a seventh via V7 may be disposed in the third-third insulating layer 133. The seventh via V7 may be electrically connected the eighth circuit pattern 148 disposed on the lower surface of the third-third insulating layer 133 and the seventh circuit pattern 147 disposed on the lower surface of the third-second insulating layer 132.

In addition, when the third insulating layer 130 is formed of a single layer, only the fifth via V5 may be disposed in the single layer of the third insulating layer 130.

Meanwhile, the vias V1, V2, V3, V4, V5, V6, and V7 may pass through only one insulating layer among the first insulating layer 110, the second insulating layer 120, and the third insulating layer 130, or alternatively, may be disposed while passing through a plurality of insulating layers in common. Accordingly, the vias V1, V2, V3, V4, V5, V6, and V7 may connect circuit patterns disposed on surfaces of insulating layers that are at least two or more apart from each other, rather than the neighboring insulating layers.

Meanwhile, the vias V1, V2, V3, V4, V5, V6, and V7 may be formed by filling the inside of a through hole (not shown) passing through at least one insulating layer among the plurality of insulating layers with a conductive material.

The through hole may be formed by any one of mechanical, laser, and chemical processing method. When the via hole is formed by mechanical processing, a method such as milling, drilling and routing may be used, when the via hole is formed by laser processing, a method of UV or $CO_2$ laser may be used, and when the via hole is formed by chemical processing, a chemical including aminosilane, ketone, or the like may be used, and accordingly, at least one insulating layer among the plurality of insulating layers may be opened.

Meanwhile, the laser processing is a cutting method in which a part of a material is melted and evaporated by concentrating optical energy at a surface to take a desired shape. Complex formation by a computer program may be easily processed, and composite materials which are difficult to cut by other methods may be processed.

In addition, the processing by the laser may have a cutting diameter of at least 0.005 mm, and has a wide range of thickness that may be processed.

It is preferable to use an yttrium aluminum garnet (YAG) laser or $CO_2$ laser or ultraviolet (UV) laser as the laser processing drill. The YAG laser is a laser capable of processing both a copper foil layer and an insulating layer, and the $CO_2$ laser is a laser capable of processing only an insulating layer.

When the through hole is formed, the first to seventh vias V1, V2, V3, V4, V5, V6 and V7 may be formed by filling an inside of the through hole with a conductive material. The metal material forming the first to seventh vias V1, V2, V3, V4, V5, V6 and V7 may be any one material selected from among copper (Cu), silver (Ag), tin (Sn), gold (Au), nickel (Ni), and palladium (Pd), and the conductive material filling may use any one or a combination of electroless plating, electrolytic plating, screen printing, sputtering, evaporation, ink-jetting and dispensing.

Meanwhile, protective layers 151 and 152 may be disposed on a surface of an outermost insulating layer among the first insulating layer 110, the second insulating layer 120, and the third insulating layer 130. For example, a first protective layer 151 may be disposed on an upper surface of an uppermost insulating layer among the plurality of insulating layers. For example, the first protective layer 151 may be disposed on an upper surface of the second-third insulating layer 123 disposed on an uppermost portion of the second insulating layer 120. In addition, a second protective layer 152 may be disposed on a lower surface of the insulating layer disposed under an lowermost insulating layer among the plurality of insulating layers. For example, the second protective layer 152 may be disposed on a lower surface of the third-third insulating layer 133 disposed under a lowermost portion of the third insulating layer 130.

In addition, when each of the second insulating layer 120 and the third insulating layer 130 is composed of a single layer, the first protective layer 151 may be disposed on an upper surface of the second insulating layer 120, and the second protective layer 152 may be disposed under a lower surface of the third insulating layer 130.

The first protective layer 151 and the second protective layer 152 may each have an opening. For example, the first protective layer 151 may have an opening exposing a surface of the fifth circuit pattern to be exposed among the fifth circuit patterns 145 disposed on the upper surface of the second-third insulating layer 123.

In addition, the second protective layer 152 may have an opening exposing a surface of the eighth circuit pattern to be exposed among the eighth circuit patterns 148 disposed on the lower surface of the third-third insulating layer 133.

The first protective layer 151 and the second protective layer 152 may include an insulating material. The first protective layer 151 and the second protective layer 152 may include various materials that can be cured by heating after being applied to protect the surface of the circuit patterns. The first protective layer 151 and the second protective layer 152 may be a resist layer. For example, the first protective layer 151 and the second protective layer 152 may be a solder resist layer including an organic polymer material. For example, the first protective layer 151 and the second protective layer 152 may include an epoxy acrylate-based resin. In detail, the first protective layer 151 and the second protective layer 152 may include a resin, a curing agent, a photo initiator, a pigment, a solvent, a filler, an additive, an acryl-based monomer, and the like. However, the embodiment is not limited thereto, and the first protective layer 151 and the second protective layer 152 may be any one of a photo solder resist layer, a cover-lay, and a polymer material.

A thickness of the first protective layer 151 and the second protective layer 152 may be 1 μm to 20 μm. The thickness of the first protective layer 151 and the second protective layer 152 may be 1 μm to 15 μm. For example, the thickness of the first protective layer 151 and the second protective layer 152 may be 5 μm to 20 μm. When the thickness of the first protective layer 151 and the second protective layer 151 is greater than 20 μm, the thickness of the circuit board may increase. When the thickness of the first protective layer 151 and the second protective layer 152 is less than 1 μm, the reliability of the circuit pattern included in the circuit board may be deteriorated.

Meanwhile, a cavity 160 may be formed in the second insulating layer 120. In this case, the cavity 160 may be formed by commonly opening the second insulating layer 120 composed of a plurality of layers.

That is, the cavity 160 in a first embodiment is provided in the second insulating layer 120. That is, the cavity 160 is formed in the second-first insulating layer 121, the second-second insulating layer 122, and the second-third insulating layer 123. In addition, the cavity 160 in the second embodiment may be formed by opening the second insulating layer 120 composed of one layer.

Hereinafter, the structure of the cavity formed in the second insulating layer 120 composed of a plurality of layers as in the first embodiment will be firstly described.

In the embodiment, the cavity 160 may be formed by opening the second-first insulating layer 121, the second-second insulating layer 122, and the second-third insulating layer 123.

Accordingly, an upper surface of the first insulating layer 110 in a region vertically overlapping the cavity 160 may be exposed through the cavity 160.

That is, the cavity 160 may include a first part P1 opening the second-first insulating layer 121, a second part P2 opening the second-second insulating layer 122, and a third part P3 opening the second-third insulating layer 123. Here, the cavity 160 is illustrated as being composed of first to third parts P1, P2, and P3 because the second insulating layer 122 of the embodiment has a three-layer structure, but the embodiment is not limited thereto. For example, when the second insulating layer 120 has a two-layer structure, the cavity 160 may include only first and second parts. For example, when the second insulating layer 122 has a five-layer structure, the cavity 160 may include first to fifth parts.

The second-first insulating layer 121 may have a first thickness T1. Here, the first thickness T1 of the second-first insulating layer 121 may mean a height from a lower surface to an upper surface of the second-first insulating layer 121.

The first thickness T1 of the second-first insulating layer 121 may be 5 μm to 20 μm. For example, the first thickness T1 of the second-first insulating layer 121 corresponds to a thickness of the second-first insulating layer 121 composed of one layer of RCC, and accordingly, it may have a thickness of 5 μm to 20 μm.

In the embodiment, the pad 141a may have a second thickness T2. The second thickness T2 of the pad 141a may be smaller than the first thickness T1 of the second-first insulating layer 121. For example, the second thickness T2 of the pad 141a may be 5 μm to 10 μm.

Meanwhile, referring to FIGS. 1a and 2a, the cavity 160 includes inner walls S1 and S2.

The inner walls S1 and S2 of the cavity 160 may have a specific surface roughness. In this case, the surface roughness of the inner walls S1 and S2 of the cavity 160 is not provided through an additional process. For example, the surface roughness of the inner walls S1 and S2 of the cavity 160 may be provided by a laser process performed in a process of forming the cavity 160.

Meanwhile, the inner wall of the cavity 160 may be divided into a plurality of portions. For example, the inner wall of the cavity 160 may be divided into a first inner wall S2 and a second inner wall S1 from a lower side (eg, a portion adjacent to an upper surface of the first insulating layer). In this case, an inclination angle of each of the first inner wall S2 and the second inner wall S1 may be different from each other.

The first inner wall S2 and the second inner wall S1 are formed through a laser process and a de-smear process, and may have a surface roughness corresponding thereto.

Meanwhile, the embodiment allow the cavity 160 to be formed using a Gaussian beam. In this case, an outermost part of the cavity 160 is processed using a center point of the Gaussian beam. That is, a laser with a greatest intensity is generated at the center point of the Gaussian beam, and accordingly, an inclination angle of the inner wall of the cavity 160 at an outermost portion may be smaller than that of the comparative example.

In other words, the inner wall of the cavity 160 may have a shape in which the first inner wall S2 and the second inner wall S1 are connected to each other from a lower side. The first inner wall S2 of the cavity 160 may be connected to a circuit pattern disposed on an upper surface of the first insulating layer 110. For example, the first inner wall S2 of the cavity 160 may be connected to a first mask pattern 141b disposed on the upper surface of the first insulating layer 110. In this case, the first inner wall S2 may be connected upward in a boundary region between the first portion 141b-1 and the second portion 141b-2 of the first mask pattern 141b.

The first inner wall S2 of the cavity 160 may have a first inclination angle θ2. For example, the first inclination angle θ2 of the first inner wall S2 of the cavity 160 may refer to an inclination angle of an imaginary straight line connecting one end E1 and the other end E3 of the first inner wall S2 with respect to a reference surface BS. For example, the reference surface BS may be an upper surface of the first insulating layer 110, but is not limited thereto.

In addition, the second inner wall S1 of the cavity 160 may have a second inclination angle θ1. For example, the second inclination angle θ-1 of the second inner wall S1 of the cavity 160 may be smaller than the first inclination angle θ2 of the first inner wall S2. The second inclination angle θ1 of the second inner wall S1 may refer to an inclination angle of an imaginary straight line connecting one end E2 and the other end E1 of the second inner wall S1.

That is, the second inner wall S1 of the inner wall of the cavity 160 is a portion processed using the center point of the Gaussian beam, and accordingly it may have a second inclination angle θ1 smaller than the first inclination angle θ2 of the first inner wall S2.

A first inclination angle θ2 of the first inner wall S2 of the inner wall of the cavity 160 may have a range of 130 degrees to 160 degrees. In addition, the second inclination angle θ1 of the second inner wall S1 of the cavity 160 may be smaller than the first inclination angle θ2 of the first inner wall S2 in a range of 92 degrees to 130 degrees.

As described above, when forming the outermost part of the cavity 160, the embodiment may be formed to have a smaller inclination angle than the comparative example by using the center point of the Gaussian beam, and thus, it can reduce an entire region occupied by the cavity 160.

In other words, the inner wall of the cavity 160 in the embodiment may have an inflection point. For example, the inner wall of the cavity 160 in the embodiment may include an inflection point E1.

In addition, the cavity 160 in the embodiment may be divided into a first inner wall S2 having a first inclination angle θ2 and a second inner wall S1 having a second inclination angle based on the inflection point E1.

In addition, a height of the inflection point E1 may be higher than an upper surface of the pad 141a and lower than an upper surface of the second-first insulating layer 121.

As described above, when forming the cavity 160, the embodiment may allow the second inner wall S1 of an outermost part of the cavity 160 to have a second inclination angle θ1 and allow the first inner wall S2 meeting the second inner wall S1 to have a first inclination angle θ2.

This can be implemented by processing the outermost part of the cavity 160 using the center point of the Gaussian beam while forming the cavity 160 by using the first mask pattern 141b, which is a part of the circuit pattern, as a stop layer, accordingly, the inclination angle of an outermost portion of the cavity 160 can be reduced compared to the comparative example, so that it can drastically reduce a space required for cavity formation.

Accordingly, the cavity 160 in the embodiment may include a first region R1 including the second inner wall S1, a second region R2 including the first inner wall S2, and a third region other than the first region R2 and the second region R3.

A first inner wall S2 of the inner wall of the cavity 160 corresponding to the second region R2 may extend upward while having a second inclination angle θ2 from the first portion S3, which is the end of the third region R3 of the cavity 160

In addition, the second inner wall S1 corresponding to the first region R1 may extend upward from the first inner wall S2 while having a third inclination angle θ1.

Meanwhile, at least a portion of the first mask pattern 141b may be exposed in the cavity 160 in the embodiment. The first mask pattern 141b may be disposed surrounding a region of the cavity 160. For example, the first mask pattern 141b may have a closed loop shape surrounding a region in which the cavity 160 is formed.

In this case, the first mask pattern 141b may include a first portion 141b-1 disposed in the second insulating layer 120 and a second portion 141b-2 exposed through the cavity 160.

A first portion 141b-1 of the first mask pattern 141b may have a second thickness T2. A second thickness T2 of the first portion 141b-1 of the first mask pattern 141b may be smaller than a first thickness T1 of the second-first insulating layer 121. For example, a second thickness T2 of the first portion 141b-1 of the first mask pattern 141b may be 5 μm to 10 μm.

The second portion 141b-2 of the first mask pattern 141b may have a third thickness T3. A third thickness T2 of the second portion 141b-2 of the first mask pattern 141b may be smaller than a second thickness T2 of the first portion 141b-1. For example, the third thickness T3 of the second portion 141b-2 of the first mask pattern 141b may be 4 μm to 8 μm.

That is, the second portion 141b-2 of the first mask pattern 141b in the embodiment is a portion formed by a two-time etching process through a two-step etching process of etching a seed layer. In addition, the third thickness T3 of the second portion 141b-2 may be smaller than the second thickness T2 of the first portion 141b-1 by a thickness of the seed layer.

Specifically, each of the first to eighth circuit patterns 141, 142, 143, 144, 145, 146, 147, and 148 included in the embodiment may have a two-layer structure.

For example, each of the first to eighth circuit patterns 141, 142, 143, 144, 145, 146, 147, and 148 may include a first metal layer 140a and a second metal layer 140b.

The first metal layer 140a may be disposed on one surface of each insulating layer. For example, the first metal layer 140a constituting the first circuit pattern 141 may directly contact an upper surface of the first insulating layer 110 and may be disposed on the upper surface of the first insulating layer 110. The first metal layer 140a may be a chemical copper plating layer. For example, the first metal layer 140a may be an electroless plating layer. The first metal layer 140a may be a seed layer for electroplating the second metal layer 140b. The second metal layer 140b may be an electrolytic plating layer formed by electroplating the first metal layer 140a as a seed layer. A thickness of the second metal layer 140b may be greater than that of the first metal layer 140a. A thickness of the first metal layer 140a may vary depending on a plating method of the first metal layer 140a. For example, a chemical copper plating layer may be classified into heavy copper plating (2 μm or more), medium copper plating (1-2 μm), and light copper plating (1 μm or less), respectively, depending on the thickness. In this case, the first metal layer 140a in the embodiment may have a thickness that satisfies 0.5 μm to 1.5 μm by medium copper plating or light copper plating. The second metal layer 140b may have a thickness ranging from 8.5 μm to 13.5 μm. Accordingly, each of the first to eighth circuit patterns 141, 142, 143, 144, 145, 146, 147, and 148 may have a thickness ranging from 10 μm to 14 μm.

In addition, the second thickness T2 of the first portion 141b-1 of the first mask pattern 141b may have a range of 10 μm to 14 μm, which is the thickness of the circuit pattern. However, the third thickness T3 of the second portion 141b-2 of the first mask pattern 141b may be as thin as a thickness of the first metal layer 140a in the first portion 141b-1.

This means that the first portion 141b-1 of the first mask pattern 141b is formed by etching the seed layer once, and the second portion 141b-2 is formed by etching the seed layer twice. Accordingly, the second portion 141b-2 may be formed thinner than the first portion 141b-2 by the thickness of the first metal layer 140a corresponding to the seed layer.

Meanwhile, the cavity may be formed in the second insulating layer 120 composed of a single layer as in the second embodiment.

A cavity 160 may be formed in the second insulating layer 120 having a single layer. In this case, the cavity 160 may be formed by opening the second insulating layer 120. Accordingly, an upper surface of the first insulating layer 110 in the region vertically overlapping the cavity 160 may be exposed.

That is, the cavity 160 may include only one part formed in the second insulating layer 120. The second insulating layer 120 may have a first thickness T1. Here, the first thickness T1 of the second insulating layer 120 may mean a height from a lower surface to an upper surface of the second insulating layer 120 of one layer.

Accordingly, a shape of the cavity in the second embodiment may substantially correspond to a shape of the cavity in the first embodiment, and thus a detailed description thereof will be omitted.

Meanwhile, a ratio of the first inner wall S2 and the second inner wall S1 of the inner wall of the cavity 160 in the embodiment may vary depending on a moving pitch of a laser beam during cavity processing, and it is possible to adjust a length ratio of the first inner wall S2 and the second inner wall S1 to 1:9 to 9:1 by adjusting the moving pitch of the laser beam.

The embodiment enables processing of a cavity in an insulating layer using a part of a circuit pattern. That is, the embodiment uses a part of the circuit pattern as a stop layer or mask for laser processing. Accordingly, it is not necessary to separately form a stop layer or mask during cavity processing using a laser, so that it can achieve process simplification and product cost reduction.

In addition, the cavity of the circuit board in the embodiment includes an inner wall. In this case, the inner wall of the cavity includes a first portion having a first inclination angle, and a second portion extending to the first portion and having a second inclination angle. In this case, the first inclination angle and the second inclination angle are different from each other. In other words, the inner wall of the cavity in the embodiment may include an inflection point at which an inclination angle changes between the first portion and the second portion. In this case, each of the first inclination angle and the second inclination angle may mean an interior angle with an upper surface of the first insulating layer exposed through the cavity. In addition, the first inclination angle may be smaller than the second inclination angle. Preferably, the second portion of the inner wall constituting an outermost portion of the cavity in the embodiment has a second inclination angle, and the first portion of the inner wall may have a first inclination angle greater than the second inclination angle. In the above embodiment, the inclination angle of the second portion of the inner wall can be reduced compared to the comparative example, a space required for forming the cavity can be minimized compared to the comparative example in a case where a same device is disposed, so that an integration density of the circuit may be improved. In other words, the embodiment may allow more circuits to be formed than the comparative example within the same area by reducing the inclination angle of the second portion of the inner wall, and thus an overall volume of the circuit board can be reduced.

In addition, the package substrate of the embodiment includes a molding layer disposed in the cavity. In this case, the first portion and the second portion of the inner wall of the cavity are disposed in contact with the molding layer. In this case, the first portion and the second portion of the inner wall of the cavity may have different inclination angles based on an inflection point rather than a single inclination angle. The structure of the cavity according to the embodiment described above can increase a surface area in contact with the molding layer, thereby improving the adhesion between the molding layer and the circuit board.

In addition, the embodiment allows a cavity to be formed through laser processing using a circuit pattern. For example, when forming a cavity using a laser, it requires a first mask pattern in a lower region of the cavity to determine a depth of the cavity, and a second mask pattern in an upper region of the cavity to surround the cavity and determine an upper width of the cavity. In this case, the comparative example allows providing the first mask pattern and the second mask pattern using separate metal layers. In contrast, the embodiment allows the use of a circuit pattern or a seed layer used to form the circuit pattern as the first mask pattern and the second mask pattern. In this case, at least a portion of the first mask pattern and the second mask pattern overlap in a vertical direction. That is, the first mask pattern and the second mask pattern of the comparative example are arranged so as not to overlap each other in the vertical direction. Accordingly, laser processing is performed to an area outside the second mask pattern due to a process deviation during laser processing in the comparative example, and accordingly, a problem of processing a part of the first insulating layer may occur. In contrast, the embodiment arranges the first mask pattern and the second mask pattern to partially overlap as described above, so that a cavity can be precisely processed in a cavity processing region, and thus reliability can be improved.

In addition, the embodiment allows an upper surface of a stop layer formed in a lower region of the cavity to have a step. For example, the circuit pattern used as the stop layer may include a first portion disposed in the second insulating layer and a second portion extending from the first portion and exposed through the cavity. A thickness of the first portion of the circuit pattern may be different from a thickness of the second portion. For example, the thickness of the second portion may be smaller than that of the first portion. That is, the second portion of the circuit pattern is etched in two stages, and thus has a thickness smaller than that of other circuit patterns. As described above, the embodiment may allow the second portion of the circuit pattern exposed through the cavity to have a thickness smaller than that of other portions, so that it can prevent an area of the cavity from being reduced by the second portion, thereby improving reliability.

Hereinafter, a package substrate including the structure of the circuit board in the first embodiment and a method for manufacturing thereof will be described.

FIG. 3 is a view showing a package substrate according to a first embodiment.

Referring to FIG. 3, a package substrate 200 in the embodiment includes a circuit board 100 shown in FIG. 1 and an electronic device 180 mounted in a cavity 160 of the circuit board 100.

The circuit board 100 described in FIGS. 1a, 1b, 2a, and 2b may be used as a package substrate 200 for mounting an electronic device 180 thereon.

In this case, since the circuit board 100 has already been described in detail above, a description thereof will be omitted.

The circuit board 100 includes a cavity 160, and the first mask pattern 141b and the pad 141a may be exposed in the cavity 160. Specifically, the second portion 141b-2 of the first circuit pattern 141 and the pad 141a may be exposed in the cavity 160.

In this case, an electronic device 180 may be an electronic component disposed in the cavity 160 of the circuit board 100, and may be classified into an active device and a passive device. In addition, the active device is a device that actively uses a nonlinear portion, and the passive device means a device that does not use a nonlinear characteristic even though both linear and nonlinear characteristics exist. In addition, the passive device may include a transistor, a IC semiconductor chip, and the like, and the passive device may include a capacitor, a resistor, and an inductor. The passive device is mounted on a conventional circuit board to increase a signal processing speed of a semiconductor chip, which is an active device, or to perform a filtering function.

Meanwhile, a connection portion 170 may be disposed on the pad 141a. A planar shape of the connection portion 170 may be a rectangle. The connection portion 170 is disposed on the pad 141a to electrically connect the electronic device 180 and the pad 141a while fixing the electronic device 180. To this end, the pad 141a may be formed of a conductive material. For example, the connection portion 170 may be a solder ball. The connection portion 170 may contain a materials of heterogeneous component in a solder. The solder may be composed of at least one of SnCu, SnPb, and SnAgCu. In addition, the material of the heterogeneous component may include any one of Al, Sb, Bi, Cu, Ni, In, Pb, Ag, Sn, Zn, Ga, Cd, and Fe.

Meanwhile, an upper surface of the electronic device 180 may be positioned higher than an uppermost surface of the circuit board 100. However, the embodiment is not limited thereto, and an upper surface of the electronic device 180 may be disposed at the same height as an uppermost surface of the circuit board 100 depending on a type of the electronic device 180, or alternatively, may be disposed lower than an uppermost surface of the circuit board 100.

FIG. 4 is a view showing a package substrate according to a second embodiment.

Referring to FIG. 4, a package substrate 200A in the embodiment includes a circuit board 100 and an electronic device 180a mounted in a cavity 160 of the circuit board 100.

In addition, the package substrate 200A is disposed in the cavity 160 and further includes a molding layer 190 covering the electronic device 180a.

The molding layer 190 may be selectively disposed in the cavity 160 to protect the electronic device 180a mounted in the cavity 160.

The molding layer 190 may be made of resin for molding, and may be, for example, EMC (Epoxy Molding Compound). However, the embodiment is not limited thereto, and the molding layer 190 may be composed of various other molding resins in addition to EMC.

The circuit board 100 may be used as a package board 200A for mounting the electronic device 180a.

The circuit board 100 includes a cavity 160, and a pad 141a may be exposed in the cavity 160.

In the embodiment, the molding layer 190 is disposed while contacting the first inner wall S2 and the second inner wall S1 of the cavity 160. In this case, the first inner wall S2 and the second inner wall S1 of the cavity 160 may have different inclination angles based on an inflection point E1 rather than a single inclination angle. The structure of the cavity 160 as described above may increase a surface area in contact with the molding layer 190, and accordingly, it is possible to improve adhesion between the molding layer 190 and the circuit board 100.

Hereinafter, a method of manufacturing a circuit board according to an embodiment will be described with reference to the accompanying drawings.

FIGS. 5 to 14 are views showing a method of manufacturing a circuit board shown in FIG. 2a in order of process. That is, the manufacturing method in the case where the second insulating layer 120 is composed of a single layer will be described below. However, the embodiment may form a cavity in a circuit board including a second insulating layer having a multilayer structure as shown in FIG. 1a by applying such a method.

Referring to FIG. 5, a first insulating layer 110 is prepared, first and second circuit patterns 141 and 142 are formed on the surface of the first insulating layer 110, and a first via V1 may be formed passing through the first insulating layer 110 to be electrically connected the first and second circuit patterns 141 and 142.

In this case, the first circuit pattern 141 and the second circuit pattern 142 may be composed of a plurality of layers.

For example, the first circuit pattern 141 may include a first-first metal layer 141-1 and a first-second metal layer 141-2. For example, the second circuit pattern 142 may include a second-first metal layer 142-1 and a second-second metal layer 142-1.

Briefly explaining the process of forming the first circuit pattern 141, the embodiment may proceed with a process of forming the first-first metal layer 141-1 by electroless plating on a surface of the first insulating layer 110. Thereafter, the embodiment may proceed with a process of forming a mask on the first-first metal layer 141-1. Thereafter, the embodiment may proceed with a process of forming an opening vertically overlapping a region where the first and second metal layers 141-2 are to be formed by exposing and developing the mask. Thereafter, the embodiment may proceed a process of electroplating the first-first metal layer 141-1 as a seed layer to form the first-second metal layer 141-2 filling the opening. Meanwhile, the first circuit pattern 141 may include a pad 141a exposed through the cavity 160 while being electrically connected to an electronic device later. In addition, the first circuit pattern 141 may include a first mask pattern 141b for later forming the cavity 160.

Meanwhile, a thickness of the first circuit pattern 141 initially formed as described above may have a second 'thickness T2'. This may be greater than the second thickness T2 that the first circuit pattern 141 should substantially have. For example, the second thickness T2' may be as thick as the thickness of the first-first metal layer 141-1 corresponding to the seed layer compared to the second thickness T2.

Next, the embodiment may proceed with a process of forming a mask M on the upper surface of the first-first metal layer 141-1. The mask M may be disposed to cover the first-first metal layer 141-1 and the first-second metal layer 141-2 formed inside the first mask pattern 141b.

Next, referring to FIG. 6, when the first-second metal layer 141-2 and the second-second metal layer 142-2 are formed, the embodiment may proceed with a process of removing the first-first metal layer 141-1 and the second-first metal layer 142-1 used as the seed layer.

In this case, the embodiment allows a metal layer disposed in a region where the cavity 160 is to be formed to remain without being removed while not removing the entire metal layer used as the seed layer.

Specifically, the cavity 160 may be formed in the second insulating layer 120 disposed on the first-first metal layer 141-1. Accordingly, the embodiment allows a portion of the first-first metal layer 141-1 to remain without removal corresponding to a region where the cavity 160 is to be formed. For example, a region that is not removed among the first-first metal layer 141-1 may be a region covered by the mask M.

That is, all portions of the first-first metal layer 141-1 that do not overlap with the first-second metal layer 141-2 in the vertical direction are generally all removed after the first circuit pattern 141 is formed. In this case, the embodiment allows the cavity 160 to remain without removing the portion positioned in a region to be formed among the portions of the first-first metal layer 141-1 that do not overlap with the first-second metal layer 141-2 in the vertical direction.

Specifically, the first-first metal layer 141-1 may be entirely formed on the upper surface of the first insulating layer 110.

In this case, the first-first metal layer 141-1 may include a first-first portion P1-1 vertically overlapping the first-second metal layer 141-2 in a region where no cavity is formed. In addition, the first-first metal layer 141-1 may include a first-second portion P1-2 that does not overlap in the vertical direction with the first-second metal layer 141-2 in a region where no cavity is formed. In addition, the first-first metal layer 141-1 may include a first-third portion P1-3 and 141-1a disposed in a cavity forming region.

Here, when the first-second metal layer 141-2 is plated and the manufacturing of the first circuit pattern 141 is completed in a manufacturing process of a general circuit board, the first-first metal layer 141-1 including the first-second portion P1-2 and the first-third portion P1-3 is removed.

Alternatively, when the manufacturing of the first circuit pattern 141 is completed as the first and second metal layers 141-2 are plated in the general circuit board manufacturing process, the embodiment allows the first-third portion P1-3 of the first-first metal layer 141-1 to remain without being removed while removing the first-second portion P1-2 of the first-first metal layer 141-1.

Accordingly, the first to third portions P1 to 3 are covered by the mask M, and thus, etching is not performed in this portion. In other words, the first-first metal layer 141-1 and the first-second metal layer 141-2 disposed in the mask M are not removed.

However, the first-first metal layer 141-1 and the first-second metal layer 141-2 in the regions other than the first-third portion P1-3 are etched. That is, the etching is a process of removing the first-first metal layer 141-1 from a portion where the first-second metal layer 141-2 is not formed. However, the first-second metal layer 141-2 is also etched in a process of removing the first-first metal layer 141-1.

Accordingly, the first mask pattern 141b may have a second thickness T2 after a first etching process.

Next, the embodiment proceeds with a process of forming a second insulating layer 120 on the upper surface of the first insulating layer 110 as shown in FIG. 7. In addition, the embodiment proceeds with a process of forming the third insulating layer 130 under the lower surface of the first insulating layer 110. In this case, the second insulating layer 120 and the third insulating layer 130 may be composed of RCC, respectively.

In addition, the embodiment may proceed with a process of forming a circuit pattern on the surface of the second insulating layer 120. For example, the embodiment may proceed with a process of forming the third circuit pattern 143 on the upper surface of the second insulating layer 120.

In addition, the embodiment may proceed with a process of forming a circuit pattern on the surface of the third insulating layer 130. For example, the embodiment may proceed with a process of forming the sixth circuit pattern 146 on the lower surface of the third insulating layer 130.

Each of the third circuit pattern 143 and the sixth circuit pattern 146 may also have a plurality of layer structures. For example, the third circuit pattern 143 may include a third-first metal layer 143-1 and a third-second metal layer 143-2. For example, the sixth circuit pattern 146 may include a fourth-first metal layer 146-1 and a fourth-second metal layer 146-2.

In addition, the embodiment may proceed with a process of forming vias in the second insulating layer 120. In addition, the embodiment may proceed with a process of forming vias in the third insulating layer 130.

Meanwhile, the third circuit pattern 143 disposed on the upper surface of the second insulating layer 120 according to the embodiment includes the third-first metal layer 143-1 and the third-first metal layer 143-2.

In this case, when the plating of the third-second metal layer 143-2 is completed in a process of manufacturing the third circuit pattern 143, the third-first metal layer 143-1 used as the plating seed layer of the third-second metal layer 143-2 is removed. In this case, the embodiment does not entirety remove the of the third-first metal layer 143-1 used as the seed layer of the third-second metal layer 143-2, so that the embodiment allows the metal layer disposed in the region where the cavity 160 is to be formed to remain without being removed.

Specifically, the embodiment allows a portion of the third-first metal layer 143-1 disposed in a region outside the cavity surrounding a region where the cavity 160 is to be formed to remain without being removed.

That is, all portions of the third-first metal layer 143-1 that do not overlap with the third-second metal layer 143-2 in the vertical direction are generally all removed the third circuit pattern 143 is formed. In this case, the embodiment allows the cavity 160 to remain without removing the portion positioned in a region to be formed among the portions of the third-first metal layer 143-1 that do not overlap with the third-second metal layer 143-2 in the vertical direction.

Specifically, the third-first metal layer 143-1 may be entirely formed on the upper surface of the second insulating layer 120.

In this case, the third-first metal layer 143-1 may include a second-first portion P2-1 overlapping the third-second metal layer 143-2 in a vertical direction. In addition, the third-first metal layer 143-1 may include a portion that does not overlap in a vertical direction with the third-second metal layer 143-2 in a region where no cavity is formed. In this case, a portion of the third-first metal layer 143-1 that does not vertically overlap with the third-second metal layer 143-2 may include the second-second portion P2-2 that overlaps a region where the cavity 160 is to be formed or is spaced apart from the region where the cavity is to be formed. In addition, a portion of the third-first metal layer 143-1 that does not vertically overlap with the third-second metal layer 143-2 may include a second-third portion P2-3 adjacent to a cavity region where the cavity 160 is to be formed.

Here, when the manufacturing of the third circuit pattern 143 is completed as the third-second metal layer 143-2 is plated in the manufacturing process of a general circuit board, the third-first metal layer 143-1 including the second-second portion P2-2 and the second-third portion P2-3 is removed.

Alternatively, when the manufacturing of the third circuit pattern 143 is completed as the third-second metal layer 143-2 is plated in the manufacturing process of the general circuit board, the embodiment allows the second-third portion P2-3 of the third-first metal layer 143-1 to remain without being removed while removing the second-second portion P2-2 of the third-first metal layer 143-1.

The second-third portion P2-3 of the third-first metal layer 143-1 may be positioned in a boundary region between a region where the cavity 160 is to be formed on the upper surface of the second insulating layer 120 and a region other than that. For example, the second-third portion P2-3 of the third-first metal layer 143-1 may be formed in a region other than a region where the cavity 160 is to be formed on the upper surface of the second insulating layer 120. For example, the second-third portion P2-3 of the third-first metal layer 143-1 may be disposed surrounding a region where the cavity 160 is to be formed on the upper surface of the second insulating layer 120.

In this case, the second-third portion P2-3 of the third-first metal layer 143-1 may have a specific width. In this case, a width of the second-third portion P2-3 of the third-first metal layer 143-1 may be greater than a radius of a beam size in a subsequent laser process. That is, the embodiment may proceed with a cavity processing process corresponding to the center portion of the beam in the Gaussian laser process. Accordingly, the center portion of the Gaussian beam is positioned at the edge region of the cavity 160. In addition, when the width of the second-third portion P2-3 of the third-first metal layer 143-1 is smaller than the radius of the beam size, regions other than the cavity formation region of the second insulating layer 120 may be processed by the Gaussian beam. Accordingly, the second-third portion P2-3 of the third-first metal layer 143-1 of the embodiment may have a larger width than the radius of the Gaussian beam.

Meanwhile, the first mask pattern 141b and the second-third portion P2-3 of the third-first metal layer 143-1 may be disposed such that at least a portion overlaps each other in a vertical direction.

That is, the comparison example is arranged so that a mask pattern and the second-third portion P2-3 of the third-first metal layer 143-1 do not overlap each other in the vertical direction during a laser process. In this case, if the accuracy of the laser process is high, it is possible to form a cavity with high reliability even in an arrangement structure of the mask as described above. However, process deviations occur due to various environments in a process of manufacturing a circuit board. Accordingly, a reliability problem may occur in the mask structure of the comparative example. For example, when a laser beam is distorted due to process deviation, the laser beam may process a region outside the first-second portion P1-2 of the first-first metal layer 141-1 in a lower region of the second insulating layer. And, processing of the first insulating layer as much as the deviating region excluding the second insulating layer may be additionally performed in this case. In addition, when the first insulating layer is processed, a reliability problem may occur.

Accordingly, the embodiment allows the first mask pattern 141b and the second-third portion P2-3 of the third-first metal layer 143-1 to include an overlap region OR in which they overlap each other in the vertical direction. Accordingly, it is possible to prevent a situation in which the first insulating layer is additionally processed by the overlap region OR even when a laser process deviation occurs, and accordingly, it can solve the reliability problem. Meanwhile, the second-third portion P2-3 of the third-first metal layer 143-1 may also be referred to as a second mask pattern. A difference between the first mask pattern and the second mask pattern is that the first mask pattern has a structure including a plurality of metal layers, but the second mask pattern has a structure including only one metal layer corresponding to the seed layer.

Next, referring to FIG. 8, the embodiment may proceed with a process of forming a cavity 160 in the second insulating layer 120. In this case, the cavity 160 may be formed by opening the second insulating layer 120 composed of a single layer, or may be formed by opening the second insulating layer 120 composed of a plurality of layers.

In this case, the cavity 160 may be formed by a laser process using a Gaussian beam.

In this case, the embodiment allows an outermost region of the cavity 160 to be formed using a center line CP of the Gaussian beam 200. In this case, a beam positioned on a right side of the center line of the Gaussian beam 200 is positioned in the cavity region, but a beam on a left side is positioned outside the cavity region.

Accordingly, the embodiment prevents the second insulating layer from being processed at a position outside the cavity region by using the second-third portion P2-3 of the third-first metal layer 143-1 as a mask pattern.

FIG. 9 is a view for explaining a cavity processing method according to an embodiment, and FIG. 10 is a view for explaining a cavity processing method according to a comparative example.

Referring to FIG. 9, the embodiment allows processing of an outermost region of the cavity 160 to be performed using the beam of a center line of the Gaussian beam based on the second-third portion P2-3 of the third-first metal layer 143-1. In addition, the embodiment allows processing of an entire region of the cavity 160 to proceed while moving the Gaussian beam a certain distance.

In this case, the embodiment uses the center line of the first Gaussian beam to process an outermost region of the cavity. In addition, when the cavity processing using the first Gaussian beam is completed, a second Gaussian beam is provided at a position spaced apart from a first Gaussian beam by a predetermined distance. In this case, the first Gaussian beam and the second Gaussian beam are spaced apart by a predetermined distance, so that the cavity 160 in the embodiment may include a second inner wall S1 having a second inclination angle θ1 in an outermost region, and a first inner wall S2 extending from the second inner wall S1 and having a first inclination angle θ2.

Meanwhile, referring to FIG. 10, the comparative example proceeds with a cavity machining process after an outer portion of the laser beam is positioned at an outermost portion of the cavity Accordingly, the inner wall of the outermost portion of the cavity in the comparative example has an inclination angle of 160 degrees or more. On the other hand, the inner wall of the outermost portion of the cavity in the embodiment has a second inclination angle in a range of 92 degrees to 130 degrees.

For example, when a cavity is processed in a region having a size of 600 μm in a process of the comparative example, the cavity is formed to 500 μm smaller than 600 μm due to the inclination angle of the inner wall of the cavity. This is because a lower region of the cavity is actually used as a cavity in which devices are mounted, but a space of about 100 μm cannot be used due to the inclination angle of the inner wall.

On the other hand, when a cavity is processed in an area of 600 μm according to the embodiment, the embodiment can improve the inclination angle of the inner wall of the cavity, so that the cavity of the embodiment is formed to 550 μm, which is greater than that of the comparative example. Accordingly, the embodiment can reduce the space required for forming the cavity, and thereby increase a circuit integration density.

Referring to FIG. 11, the embodiment allows the formation of the cavity 160 by opening the second insulating layer 120 using the Gaussian beam as described above.

In this case, the cavity 160 may be formed while exposing the first mask pattern 141b and the first-second portion P1-2 of the first-first metal layer 141-1. Preferably, the cavity 160 may be formed from an upper surface of the second insulating layer to an upper surface of the first mask pattern 141b and the first-second portion P1-2 of the first-first metal layer 141-1.

Here, at least a portion of the first mask pattern 141b and the second-third portion P2-3 of the third-first metal layer 143-1 includes an overlapping region OR overlapping in a vertical direction.

Accordingly, an upper surface of at least a portion of the first mask pattern 141b does not vertically overlap the cavity.

Referring to FIG. 12, the embodiment may proceed with a process of de-smearing. The de-smearing process may be one step of a cavity formation process. That is, the embodiment forms a final cavity through a process of de-smearing after forming a cavity through laser processing.

The de-smearing process may increase an overall width of the cavity while maintaining a shape of the cavity formed by a laser processing. That is, the de-smearing process can increase an overall width of the cavity while removing foreign substances included in the inner wall of the cavity formed by a laser process.

That is, the first mask pattern 141b includes a first portion of a region that does not vertically overlap the cavity and a second portion of a region that vertically overlaps the cavity. In addition, the de-smearing process may be a process of increasing a width of the second portion of the first mask pattern 141b. That is, a width of the second portion of the first mask pattern 141b before the de-smearing process is performed may be smaller than a width of the second portion of the first mask pattern 141b after the de-smearing process is performed.

Next, referring to FIG. 13, the embodiment may proceed with a process of removing the first-second portion P1-2 of the first-first metal layer 141-1 and the second-third portion P2-3 of the third-first metal layer 143-1 used as a mask pattern during the laser processing.

As described above, a final cavity 160 may be formed by removing the first-second portion P1-2 of the first-first metal layer 141-1.

That is, the inner wall of the cavity 160 formed by the above process may be divided into a plurality of parts. For example, the cavity 160 may be divided into a first inner wall S2 and a second inner wall S1.

Next, referring to FIG. 14, the embodiment may proceed with a process of removing the first-first metal layer 141-1 in a region vertically overlapped with the cavity 160.

That is, a stop layer for the laser process of the embodiment may have a ring structure including a first-first metal layer 141-1 connected to the first circuit pattern 141 and the first mask pattern 141b. In addition, the first-first metal layer 141-1 in the cavity 160 may be removed after the cavity 160 is formed.

The pad 141a and the first mask pattern 141b may be exposed within the region where the cavity 160 is formed.

In this case, the first mask pattern 141b has already been etched once in an etching process of the first-first metal layer 141-1 included in a region other than the cavity 160 region.

In addition, the first mask pattern 141b and the pad 141a may be etched in an etching process of the first-first metal layer 141-1 in the cavity 160 region.

In this case, the pad 141a may have a second' thickness T2' and then have a second thickness T2 after the etching process.

However, only the second portion 141b-2 of the first mask pattern 141b excluding the first portion 141b-1 is exposed through the cavity 160. The second portion 141b-2 is etched again in the process of removing the first-first metal layer 141-1 in the region where the cavity 160 is formed unlike the first portion 141b-2. Accordingly, the first portion 141b-1 of the first mask pattern 141b has a second thickness T2, and the second portion 141b-2 exposed through the cavity 160 has a third thickness T3 smaller than the second thickness T2.

In addition, the embodiment proceeds with a process of forming protective layers 151 and 152 on an outermost portions of the second insulating layer 120 and the third insulating layer 130.

For example, a first protective layer 151 may be disposed on an upper surface of an uppermost insulating layer among the plurality of insulating layers. For example, a first protective layer 151 may be disposed on an upper surface of the second insulating layer 120. In addition, a second protective layer 152 may be disposed on a lower surface of a lowermost insulating layer among the plurality of insulating layers. For example, the second protective layer 152 may be disposed on a lower surface of the third insulating layer 130.

Features, structures, effects, etc. described in the above embodiments are included in at least one embodiment, and are not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and modifications should be interpreted as being included in the scope of the embodiments.

In the above, the embodiment has been mainly described, but this is only an example and does not limit the embodiment, those of ordinary skill in the art to which the embodiment pertains will appreciate that various modifications and applications not illustrated above are possible without departing from the essential characteristics of the present embodiment. For example, each component specifically shown in the embodiment can be implemented by modification. And differences related to such modifications and applications should be construed as being included in the scope of the embodiments set forth in the appended claims.

What is claimed is:

1. A circuit board, comprising:
a first insulating layer;
a second insulating layer disposed on the first insulating layer and including a cavity;
a circuit layer embedded in the second insulating layer; and
an electronic device disposed in the cavity of the second insulating layer; wherein an inner wall surface forming the cavity includes:
a first surface having a first inclination angle with respect to an upper surface of the first insulating layer, a second surface disposed on the first surface and having a second inclination angle different from the first inclination angle with respect to the upper surface of the first insulating layer, and a first contact portion in which the first surface and the second surface contact each other, wherein the circuit layer includes:
a first via electrode overlapping the first surface of the cavity along a horizontal direction, a second via electrode disposed on the first via electrode and overlapping the second surface along the horizontal direction without overlapping the first surface along the horizontal direction, and an upper circuit pattern disposed between the first via electrode and the second via electrode and overlapping the second surface along the horizontal direction without overlapping the first surface along the horizontal direction, wherein the first via electrode and the second via electrode overlaps each other along a vertical direction perpendicular to the horizontal direction, and wherein the electronic device overlaps the first via electrode, the second via electrode, and the upper circuit pattern, and the first contact portion in the horizontal direction.

2. The circuit board of claim 1, further comprising:
a protective layer disposed on the second insulating layer.

3. The circuit board of claim 2, wherein the protective layer has a through hole overlapping the cavity along the vertical direction.

4. The circuit board of claim 1, wherein the first contact portion is a portion in which an inclination angle at which the first surface and the second surface directly contact each other is changed.

5. The circuit board of claim 4, wherein the electronic device is spaced apart from the first surface and the second surface along the horizontal direction.

6. The circuit board of claim 5, wherein at least a portion of the first via electrode is disposed closer to the first insulating layer than the first contact portion.

7. The circuit board of claim 1, wherein the first insulating layer and the second insulating layer include a same insulating material.

8. The circuit board of claim 7, wherein the second insulating layer is provided with a plurality of layers laminated along the vertical direction, and wherein the cavity is provided to pass through the second insulating layer provided with the plurality of layers along the vertical direction.

9. The circuit board of claim 1, wherein a thickness of the electronic device in the vertical direction is greater than a thickness of each of the first via electrode or the second via electrode in the vertical direction.

10. The circuit board of claim 1, wherein the first inclination angle is greater than the second inclination angle.

11. The circuit board of claim 10, wherein the first inclination angle has a range of 130 degrees to 160 degrees, and wherein the second inclination angle has a range of 92 degrees to 130 degrees.

12. The circuit board of claim 1, wherein each of the first via electrode and the second via electrode has a width in the horizontal direction that decreases toward the first insulating layer.

13. The package substrate of claim 1, further comprising:
a buried insulating layer disposed in the cavity and embedding the electronic device, and wherein the buried insulating layer contacts the first surface, the second surface, and the first contact portion of the cavity.

14. The circuit board of claim 1, further comprising:
a first internal circuit pattern disposed between the first insulating layer and the second insulating layer and overlapping the first surface or the second surface along the vertical direction, wherein an upper surface of the first internal circuit pattern has a step.

15. The circuit board of claim 14, wherein the upper surface of the first internal circuit pattern includes a first portion covered with the second insulating layer, and a second portion extending from the first portion and not covered with the second insulating layer, and wherein the thickness of the first portion is greater than the thickness of the second portion.

16. The circuit board of claim 15, wherein the first internal circuit pattern includes a side wall connecting the first portion and the second portion, and wherein an inclination angle of the side wall is different from the first inclination angle and the second inclination angle.

17. The circuit board of claim 16, further comprising:
a second internal circuit pattern embedded in the second insulating layer and not overlapping the cavity along the vertical direction, and a third internal circuit pattern overlapping the cavity along the vertical direction and not in contact with the second insulating layer;
wherein the first internal circuit pattern is disposed between the second internal circuit pattern and the third internal circuit pattern.

18. The package substrate of claim 17, wherein the third internal circuit pattern does not have a step, and wherein the electronic device is disposed on the third internal circuit pattern.

19. The package substrate of claim 18, wherein the second internal circuit pattern does not have a step, and wherein the second internal circuit pattern and the third internal circuit pattern have a same thickness.

20. The package substrate of claim 18, wherein the second internal circuit pattern overlaps the side wall along the horizontal direction.

\* \* \* \* \*